(12) United States Patent
Arita

(10) Patent No.: US 7,388,780 B2
(45) Date of Patent: Jun. 17, 2008

(54) SEMICONDUCTOR MEMORY DEVICE AND CONTROL METHOD FOR THE SEMICONDUCTOR MEMORY DEVICE

(75) Inventor: Makoto Arita, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 213 days.

(21) Appl. No.: 11/471,475

(22) Filed: Jun. 21, 2006

(65) Prior Publication Data

US 2007/0011512 A1   Jan. 11, 2007

(30) Foreign Application Priority Data

Jun. 22, 2005   (JP) ............................. 2005-181971

(51) Int. Cl.
*G11C 16/04* (2006.01)
(52) U.S. Cl. ............................. 365/185.03; 365/185.17
(58) Field of Classification Search .......... 365/185.03, 365/185.17, 185.24
See application file for complete search history.

(56) References Cited

U.S. PATENT DOCUMENTS

2007/0255893 A1 * 11/2007 Takeuchi .................... 711/103

FOREIGN PATENT DOCUMENTS

JP   2001-93288 A   4/2001

* cited by examiner

*Primary Examiner*—Vu A Le
(74) *Attorney, Agent, or Firm*—McDermott Will & Emery LLP

(57) ABSTRACT

A memory cell array for memorizing data with any of 0th through fourth threshold voltages and a flag memory unit for memorizing a flag data showing a chronological sequence relationship between writing operations in which data in first and second pages are respectively written are provided. A controller shifts a state of the memory cell from the 0th state to the 0th or first state in accordance with the data in the first page, and shifts the state of the memory cell to any of the 0th, first, second and third states in accordance with the data in the second page in a "forward" writing operation. The controller shifts the state of the memory cell from the 0th state to the 0th or third state in accordance with the data in the second page, and shifts the state of the memory cell to any of the 0th, first, third and fourth states in accordance with the data in the first page in a "reverse" writing operation. A flag data showing the "reverse" writing operation is then memorized in the flag memory unit.

15 Claims, 23 Drawing Sheets

F I G. 1
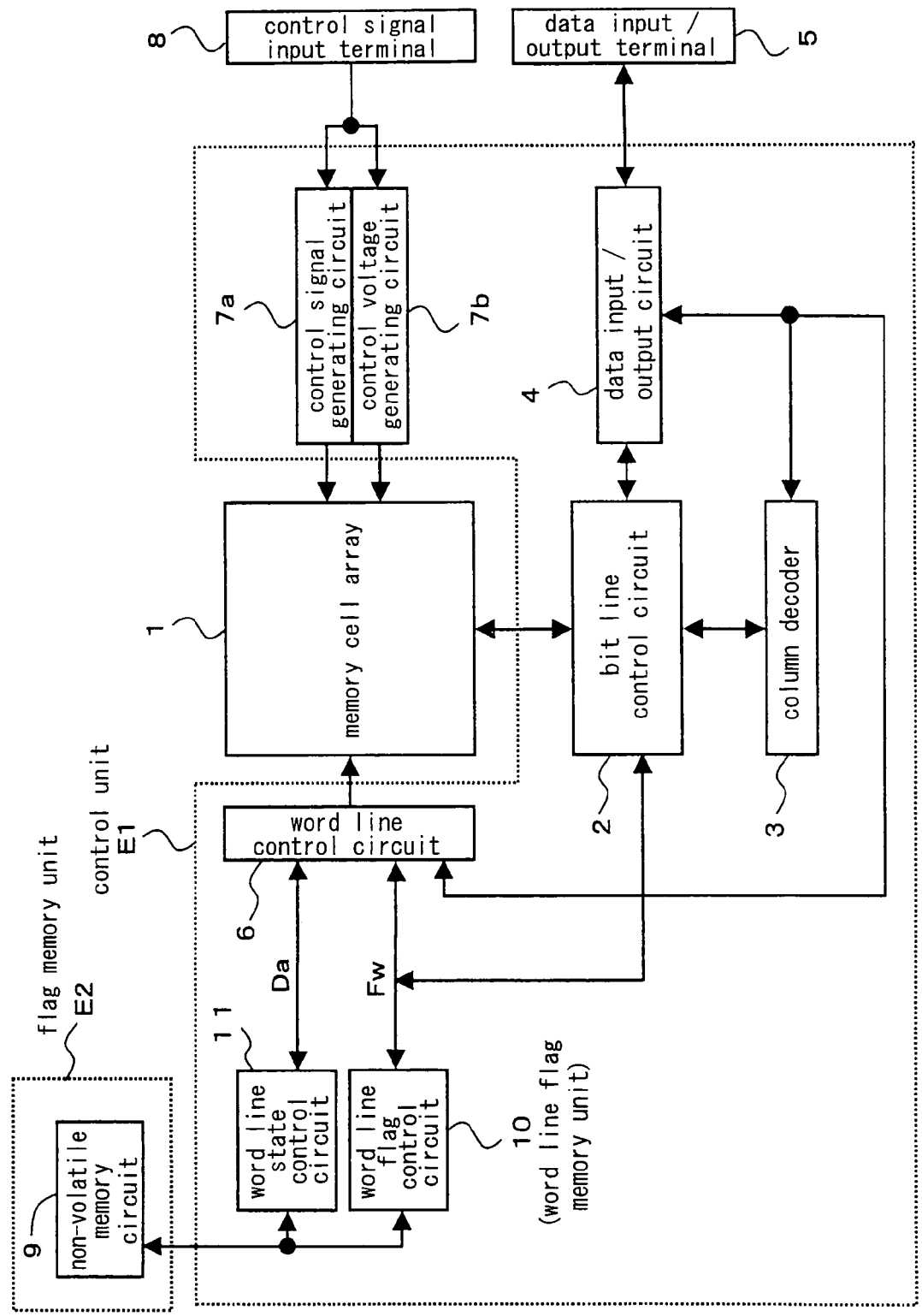

F I G. 1 7
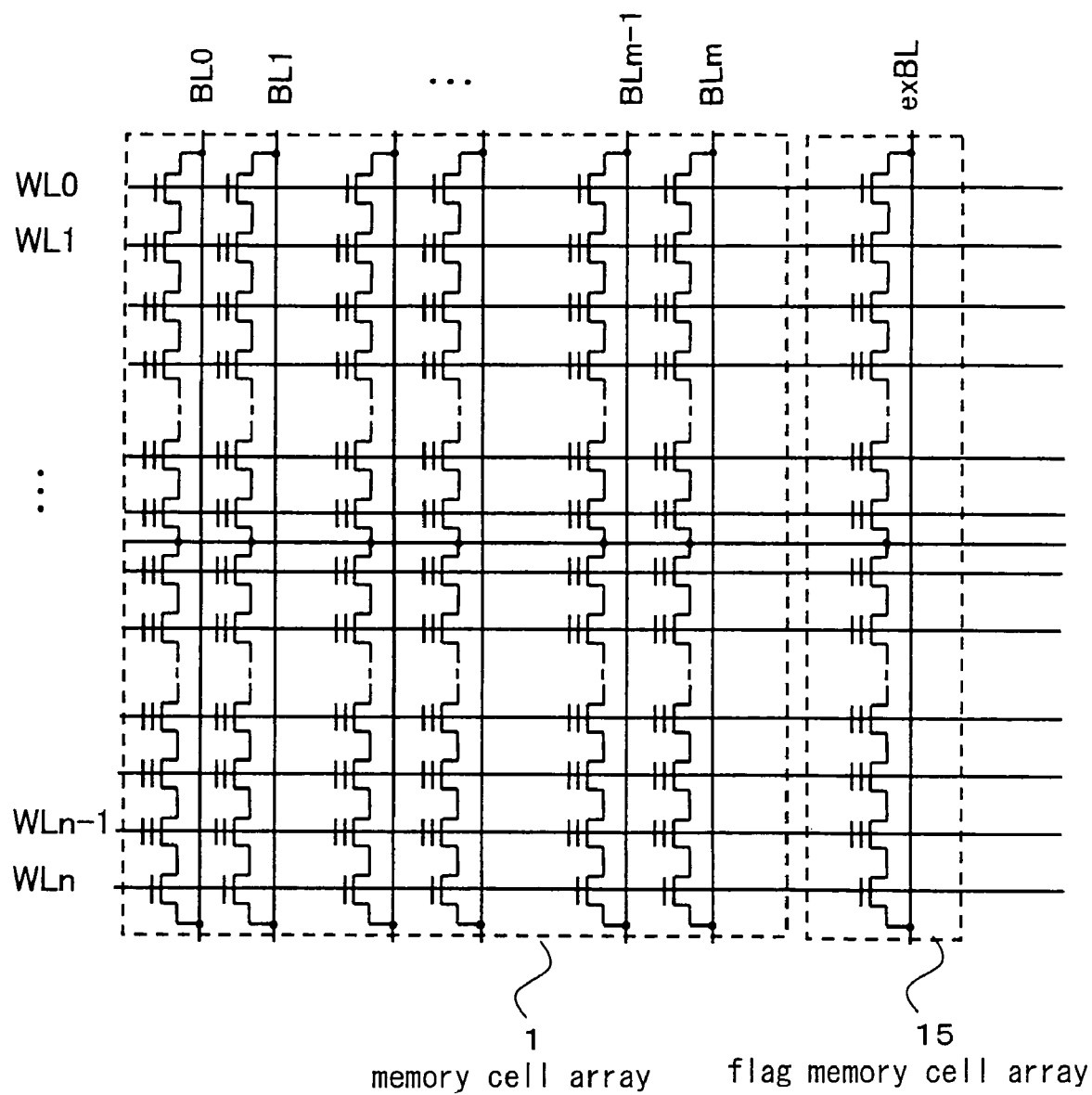

SEMICONDUCTOR MEMORY DEVICE AND CONTROL METHOD FOR THE SEMICONDUCTOR MEMORY DEVICE

BACKGROUND OF THE INVENTION

1. Field of the Invention

The present invention relates to a semiconductor memory device capable of memorizing multiple-value data and a control method for the semiconductor memory device.

2. Description of the Related Art

A NAND flash memory wherein EEPROM (Electrically Erasable and Programmable Read Only Memory) is used has been proposed as a non-volatile semiconductor capable of electrically rewriting data. In the NAND flash memory, sources and drains of a plurality of memory cells adjacently placed are serially connected, and the multiple memory cells serially connected is connected to a bit line as a unit. In the NAND flash memory, the data is written in and read from all or half of the plural cells placed in a row direction.

Recently, a multiple-value memory for memorizing a plural data in a cell of the NAND flash memory has been developed. No. 2001-93288 of the Publication of the Unexamined Japanese Patent Applications discloses a data writing method, and the like, for the multiple-value NAND flash memory, which is an example the technology.

FIG. 22 shows the data writing method recited in the document mentioned above. When the data is written in the memory cell, a threshold voltage of the memory cell is not changed by the writing operation in the case that the write data constituting a data in a first or second page is "1". In other words, there is no change in the data in the memory cell, that is, the data is not written in the cell. The threshold voltage of the memory cell is changed by the writing operation in the case that the write data constituting the data in the first or second page is "0". In other words, the data in the memory cell is changed, that is, the data is written in the cell.

Assuming that the data in the memory cell in an erased state is "0" (data "11": data "1" in the second page, data "1" in the first page), first, the data in the first page is written in the memory cell. When the write data is "1", the data in the memory cell remains "0" (data "11"). When the write data is "0", the data in the memory cell shifts to "1" (data "10").

Next, the data in the second page is written in the memory cell. In the case that the write data "0" is supplied from outside to the memory cell whose data shifts to "1" (data "10") by the write operation in the first page, the data in the memory cell shifts to "2" (data "00"). In the case that the write data "0" is supplied from outside to the memory cell whose data remains "0" (data "11") by the write operation in the first page, the data in the memory cell shifts to "3" (data "01").

FIG. 23 shows the data reading method recited in the foregoing document. When the data in the second page is read from the memory cell, the read data is "1" in the case that the data in the memory cell is "0" (data "11") or "1" (data "10"), while the read data is "0" in the case that the data in the memory cell is "2" (data "00") or "3" (data "01"). Therefore, the data can be read from the memory cell if it is judged if the data in the memory cell is at most "1", or at least "2". Accordingly, the data is read from the memory cell by setting a word-line voltage when the data is read to a second judgment level which is a voltage between "1" and "2".

The read data is "1" if the data in the memory cell is "0" (data "11") or "3" (data "01") in reading the data in the first page, while the read data is "0" if the data in the memory cell is "1" (data "10") or "2" (data "00"). Therefore, the data in the first page can be read by judging if the data in the memory cell is at least "0" or at least "1", and if the data in the memory cell is at most "2" state or "3". More specifically, the data in the first page can be read in the two reading operations, which are respectively the reading operation where the word-line voltage when the data is read is set to a first judgment level which is a voltage between "0" and "1", and the reading operation where the word-line voltage is set to a third judgment level which is a voltage between "2" and "3".

FIG. 21 shows a schematic constitution of the conventional non-volatile semiconductor memory device, for example, a structure of the NAND flash memory for memorizing quaternary data (two bits). A memory cell array 1 includes a plurality of bit lines, a plurality of word lines and a common source line, wherein memory cells comprising, for example, EEPROM cells, and capable of electrically rewriting data are arranged in a matrix shape. A bit line control circuit 2 for controlling the bit lines and a word line control circuit 6 are connected to the memory cell 1.

The bit line control circuit 2 includes a plurality of data memory circuits as described later. The bit line control circuit executes a processing in which the data in the memory cell in the memory cell array 1 is read via the bit line, a processing in which a state of the memory cell in the memory cell array 1 is read via the bit line, and a processing in which a write control voltage is applied to the memory cell in the memory cell array 1 via the bit line so that the data is written in the memory cell. A column decoder 3 and a data input/output circuit 4 are connected to the bit line control circuit 2. Any of the data memory circuits in the bit line control circuit 2 is selected by the column decoder 3. The data in the memory cell read via the selected data memory circuit is outputted outside from the data input/output terminal 5 via the data input/output circuit 4. The write data inputted to the data input/output terminal 5 from outside is inputted to the data memory circuit via the data input/output circuit 4. The data memory circuit in which the data is inputted is selected by the column decoder 3.

The word line control circuit 6 is connected to the memory cell array 1. The word line control circuit 6 selects any of the word lines of the memory cell array 1, and supplies a voltage necessary for reading, writing or erasing the data to the selected word line.

The memory cell array 1, bit line control circuit 2, column decoder 3, data input/output circuit 4 and word line control circuit 6 are connected to a control signal generating circuit 7a and a control voltage generating circuit 7b, and controlled by the control signal generating circuit 7a and the control voltage generating circuit 7b. The control signal generating circuit 7a and the control voltage generating circuit 7b are connected to a control signal input terminal 8. The respective components 1-4 and 6 of the memory cell array 1 are controlled by a control signal inputted to the control signal input terminal 8 from outside. The control voltage generating circuit 7b generates voltages respectively required for programming, verifying, reading, and erasing the data to supply the generated voltages to the components 1-4 and 6 of the memory cell array 1.

There is a problem that the data writing operation must is executed according to a "forward direction" as first page→second page in the conventional multiple-value memory cells described above. The problem is described in detail as follows.

When the data in the first page is written in the conventional multiple-value memory cell in the erased state, that is, the state "0" (data "11), the write data "1" and the write state "0" respectively shift to "0" (data "11) or "1" (data "10) in the memory cell. When the data in the second page is subsequently written in the current state, the write data "1" and the write data "0" respectively shift to any of "0" (data "11"), "1" (data "10"), "2" (data "00") and "3" (data "01") in the memory cell (processing according to the forward order, first page→second page).

However, when the data is written in a "reverse direction" in which the data in the second page is written in the erased state before the data in the first page is written, the write data of the second page "1" and "0" respectively shift to "0" (data "11") and "3" (data "01").

In the case of memory cells of floating gate type such as the NAND flash memory or the like, the threshold value of the memory cells is made higher by the data write operation, while lower by the data erasing. Therefore, it is not possible to change "3", which is the highest threshold voltage in the four states in the writing operation, back to "1" or "2". Then, the data in the first page cannot be written in the writing operation in the "reverse direction" because there trouble is generated in a sequential shift of the memory cell (threshold voltage). As a result, the data cannot be recorded as the multiple-value memory. Due to the disadvantage, the conventional writing operation could be limitedly executed only in the "forward direction", first page→second page, there has been a problem that it is not possible to write the data in the multiple-value flash memory at random addresses.

SUMMARY OF THE INVENTION

Therefore, a main object of the present invention is to realize a writing operation in which data can be written at random addresses in a multiple-value flash memory.

In order to achieve the foregoing object, a semiconductor memory device according to the present invention, in order to memorize a n-value data (n is an integer at least two), memorizes the data in a state where the data can be discriminated based on any of a plurality of threshold voltages comprising at least $2^n+1$ different to each other.

In the foregoing constitution, a correspondence relationship between the threshold voltage and the data is preferably changed in accordance with a sequence of addresses at which the data is written in order to change a definition of the threshold value according to the sequence of addresses.

Focusing on a writing control configuration, a semiconductor memory device according to the present invention comprises,
 a memory cell array comprising a plurality of memory cells for memorizing data in a state that the data can be discriminated based on any of 0th through fourth threshold voltages having such a magnitude correlation as 0th threshold voltage<first threshold voltage<second threshold voltage<third threshold voltage<fourth threshold voltage, wherein the memory cells is arranged in a lattice shape and respectively connected to word lines and bit lines,
 a controller for controlling writing operations in which the data in first and second pages are written in the memory cell, and
 a flag memory unit for memorizing a flag data showing a relationship of time context between the writing operation in which the data in the first page is written in the memory cell and the writing operation in which the data in the second page is written in the memory cell, wherein
 the controller executes:
 an operation in which a state of the memory cell is shifted from the state where the data can be discriminated based on the 0th threshold voltage to the state where the data can be discriminated based on the 0th threshold voltage or the first threshold voltage in accordance with the data to be written in the writing operation of the first page according to a "forward" (first page→second page) writing sequence,
 an operation in which the state of the memory cell is shifted to the state where the data can be discriminated based on any of the 0th threshold voltage, the first threshold voltage, the second threshold voltage and the third threshold voltage in accordance with the data to be written in the writing operation of the second page according to the "forward" writing sequence,
 an operation in which the state of the memory cell is shifted from the state where the data can be discriminated based on the 0th threshold voltage to the state where the data can be discriminated based on the 0th threshold voltage or the third threshold voltage in accordance with the data to be written in the writing operation in the writing operation of the second page according to a "reverse" (second page→first page) writing sequence, and
 an operation in which the state of the memory cell is shifted to the state where the data can be discriminated based on any of the 0th threshold voltage, the first threshold voltage, the third threshold voltage and the fourth threshold voltage in accordance with the data to be written in the writing operation in the writing operation of the first page according to the "reverse" writing sequence, and
 the flag memory unit memorizes a flag data showing the "reverse" writing sequence in the two writing operations where the data is written in the "reverse" writing sequence.

In the foregoing constitution, the numeral n=2. Therefore, the number of the threshold voltage states, at least $2^n+1$, is at least five. In the described constitution, the five states, means the 0th, first, second, third and fourth threshold voltages.

In the foregoing constitution, the flag memory unit memorizes a flag data showing the "forward" writing sequence in the two writing operations in the "forward" writing sequence, and
 It is preferable that the controller executes:
 an operation where it is judged that the state of the memory cell allows the data to be discriminated based on which of the 0th threshold voltage, the first threshold voltage, the second threshold voltage and the third threshold voltage, and the data is read from the memory cell based on a result of the judgment when the flag data memorized in the flag memory unit shows the "forward" writing sequence, and
 an operation in which it is judged that the state of the memory cell allows the data to be discriminated based on which of the 0th threshold voltage, the first threshold voltage, the third threshold voltage and the fourth threshold voltage, and the data is read from the memory cell based on a result of the judgment when the flag data memorized in the flag memory unit shows the "reverse" writing sequence.

The flag data showing the "reverse" writing sequence is referenced in a data reading operation later.

A control method for semiconductor memory device according to the present invention comprises,

- a first step, wherein the semiconductor memory device includes a plurality of memory cells for memorizing data in a state where the data can be discriminated based on any of 0th through fourth threshold voltages having such a magnitude relation as 0th threshold voltage<first threshold voltage<second threshold voltage<third threshold voltage<fourth threshold voltage, and when a data in a first page is written in a "forward" writing sequence (first page→second page) in a memory cell array comprising a plurality of memory cells arranged in a lattice shape and respectively connected to word lines and bit lines, a state of the memory cell is shifted from the state in which the data can be discriminated based on the 0th threshold voltage to the state where the data can be discriminated based on the 0th threshold voltage or the first threshold voltage in accordance with the data to be written,
- a second step wherein the state of the memory cell is shifted to the state where the data can be discriminated based on any of the 0th threshold voltage, the first threshold voltage, the second threshold voltage and the third threshold voltage in accordance with the data to be written when a data in a second page is written in the memory cell array in the "forward" writing sequence,
- a third step wherein the state of the memory cell is shifted from the state where the data can be discriminated with the 0th threshold voltage to the state where the data can be discriminated with the 0th threshold voltage or the third threshold voltage in accordance with the data to be written when the data in the second page is written in the memory cell array in a "reverse" (second page→first page) writing sequence, and
- a fourth step wherein the state of the memory cell is shifted to the state where the data can be discriminated based on any of the 0th threshold voltage, the first threshold voltage, the third threshold voltage and the fourth threshold voltage in accordance with the data to be written when the data in the first page is written in the memory cell array in the "reverse" writing sequence, wherein
- a flag data showing the "forward" writing sequence is memorized in the first and second steps, and
- a flag data showing the "reverse" writing sequence is memorized in the third and fourth steps.

In the "forward" writing sequence, the states of the preceding page (first page) are in the 0th state and in the first state, and those of the subsequent page (second page) are in the 0th, first, second and third states, which is described in detail below.

When the data in the subsequent page is then written after the data in the preceding page is first written in the 0th state, the threshold voltage in the 0th state is used when the data is not changed, while the threshold voltage in the third state is used when the data is changed. In that case, the threshold voltage shifts in such a manner as 0th state→0th state and 0th state→third state, wherein the threshold voltage does not happen to turn back.

When the data in the preceding page is first written in the first state and thereafter the data in the subsequent page is written, the threshold voltage in the first state is used when the data is not changed, while the threshold voltage in the second state is used when the data is changed. In that case, the threshold voltage shifts in such a manner as first state→first state and first state→second state, wherein the threshold voltage cases, the sequent does not happen to turn back.

In either of the foregoing ial shift of the state of the memory cell is not an obstacle in the writing operation in the "forward" writing sequence in a manner similar to that of the conventional technology.

In the writing operation in the "reverse" writing sequence, the preceding page (second page) is in the 0th or in the third state. The subsequent page (first page) is in any of the 0th, first, third and fourth states, which is described in detail below.

When the data in the preceding page is first written based on the threshold voltage in the 0th state and thereafter the data in the subsequent page is written, the threshold voltage in the 0th state is used when the data is not changed, while the threshold voltage in the first state is used when the data is changed. In that case, the threshold voltage shifts in such a manner as 0th state→0th state and 0th state→first state, and the threshold voltage does not happen to turn back.

When the data in the preceding page is first written with the threshold voltage in the third state and thereafter the data in the subsequent page is written, the threshold voltage in the third state is used when the data is not changed, while the threshold voltage in the fourth state is used when the data is changed. In that case, the threshold voltage shifts in such a manner as third state→third state and third state→fourth state, and the threshold voltage does not happen to turn back.

In either of the foregoing cases, the sequential shift is not an obstacle in the state of the threshold voltage in the writing operation in the "reverse" writing sequence in the same manner as in the "forward" writing sequence.

As described, in the semiconductor memory device according to the present invention, the multiple-value data can be written in the memory cell at the random addresses in either of the "forward" and "reverse" writing sequences.

Focusing on a reading control construction, in the semiconductor memory device according to the present invention, the flag memory unit memorizes the flag data showing the "forward" writing sequence in the two writing operations in the "forward" writing sequence, and the controller executes:

an operation wherein it is judged that the state of the memory cell is in a state capable of discriminating the data based on which of the 0th threshold voltage, the first threshold voltage, the second threshold voltage and the third threshold voltage, and thereafter the data is read from the memory cells based on a result of the judgment when the flag data memorized in the flag memory unit shows the "forward" writing sequence, and an operation wherein it is judged that the state of the memory cell is in a state capable of discriminating the data based on which of the 0th threshold voltage, the first threshold voltage, the third threshold voltage and the fourth threshold voltage, and thereafter the data is read from the memory cells based on a result of the judgment when the flag data memorized in the flag memory shows the "reverse" writing sequence.

Focusing on the reading control construction, the semiconductor memory device according to the present invention further includes, a step where the memorized flag data is read,
a step where it is judged that the state of the memory cell is in a state capable of discriminating the data based on which of the 0th threshold voltage, the first threshold voltage, the second threshold voltage and the third threshold voltage, and thereafter the data is read from the memory cells based on a result of the judgment when the read flag data shows the "forward" writing sequence, and a step where it is judged that the state of the memory cell is in a state capable of discriminating the data based on which of the 0th threshold voltage, the first threshold voltage, the third threshold voltage and the fourth threshold voltage, and thereafter the data is read from the memory cells based on a result of the judgment when the read flag data shows the "reverse" writing sequence.

According to the foregoing constitution, the flag data can be referenced regardless of whether the writing sequence with respect to the memory cell is either of the "forward" direction or the "reverse" direction so that the state of the memory cell can be adjusted. As a result, the multiple-value data can be read from the memory cell array at the random addresses.

It is preferable to take the following structure with respect to the judgment level in reading the data in the second page in the foregoing constitution, it is judged that the state of the memory cell is in a state capable of discriminating the data based on the first threshold voltage or the second threshold voltage in the state of the memory cell when the data in the second page is read, and thereafter the data in the second page is read.

This is the same way to read the data as the one to read the second page in the conventional technology. In such a manner, construction of the reading control unit is able to prevent from being complicated.

The semiconductor memory device preferably further comprises a volatile memory capable of reading and writing the data at a high speed, such as a SRAM buffer between the controller and the flag memory unit, wherein the controller transfers the flag data from the flag memory unit to the volatile memory at a desired timing and transfers the flag data from the volatile memory to the flag memory unit at a timing different to the desired timing. As a result, the writing and reading operations can be achieved at a higher speed.

The semiconductor memory device preferably further comprises a word line flag memory unit for memorizing the flag data in each word line in the above construction.

The semiconductor memory device preferably further comprises a chip flag memory unit for managing states of all of the flag data. Accordingly, the "forward" writing sequence or the "reverse" writing sequence is judged in each chip (memory cell array), and the judgment of the flag data in each word line can be omitted in any chip in the "forward" writing sequence. As a result, the reading operation can be achieved at a higher speed.

The semiconductor memory device preferably further comprises a block flag memory unit for managing the state of the flag data for each block containing a plurality of pages as a unit. Accordingly, the "forward" writing sequence or the "reverse" writing sequence is judged in each block, and the judgment of the flag data can be omitted in any block in the "forward" writing sequence. As a result, the high-speed reading operation can be achieved.

In the foregoing constitution, the word line flag memory unit is preferably a flag memory cell of the same kind as the memory cells provided on the same word line among the word lines of the memory cell array. Accordingly, a region where the flag data and the data in a written state are memorized, can be reduced in its area, which is effective for cost reduction.

The semiconductor memory device preferably further comprises a flag cell bit line control circuit having the following content. The flag cell bit line control circuit shifts a state of the flag memory cell from the state where the data can be discriminated based on the 0th threshold voltage to the state where the data can be discriminated based on the first threshold voltage in the writing operation in the "forward" writing sequence, and shifts the state of the flag memory cell from the state where the data can be discriminated based on the 0th threshold voltage to the state where the data can be discriminated based on the third threshold voltage in the writing operation in the "reverse" writing sequence. Accordingly, when the data is read from the memory cell array, number of times to set the necessary word lines can be reduced, which realizes a high-speed processing.

In the foregoing constitution, the flag cell bit line control circuit preferably sets a word-line voltage to a voltage between the second threshold voltage and the third threshold voltage in order to judge the state of the flag memory cell.

According to the present invention, the data can be memorized in the memory cell as the multiple-value data even though the data is written in the "reverse" writing sequence.

Further, the reading and writing operations can be executed at a higher speed. Further, the region where the flag data and the data in a state to be written are memorized can be decreased in its area, which is effective for the cost reduction.

The technology according to the present invention is effective as a semiconductor memory device such as an NAND flash memory provided with EEPROM capable of memorizing a multiple-value data and a control method thereof.

BRIEF DESCRIPTION OF THE DRAWINGS

These and other objects as well as advantages of the invention will become clear by the following description of preferred embodiments of the invention. A number of benefits not recited in this specification will come to the attention of the skilled in the art upon the implementation of the present invention.

FIG. 1 is a block diagram illustrating a constitution of a semiconductor memory device according to a preferred embodiment 1 of the present invention.

FIG. 17 shows a memory cell array in the semiconductor memory device according to the preferred embodiment 5.

DETAILED DESCRIPTION OF THE INVENTION

Figure 2:
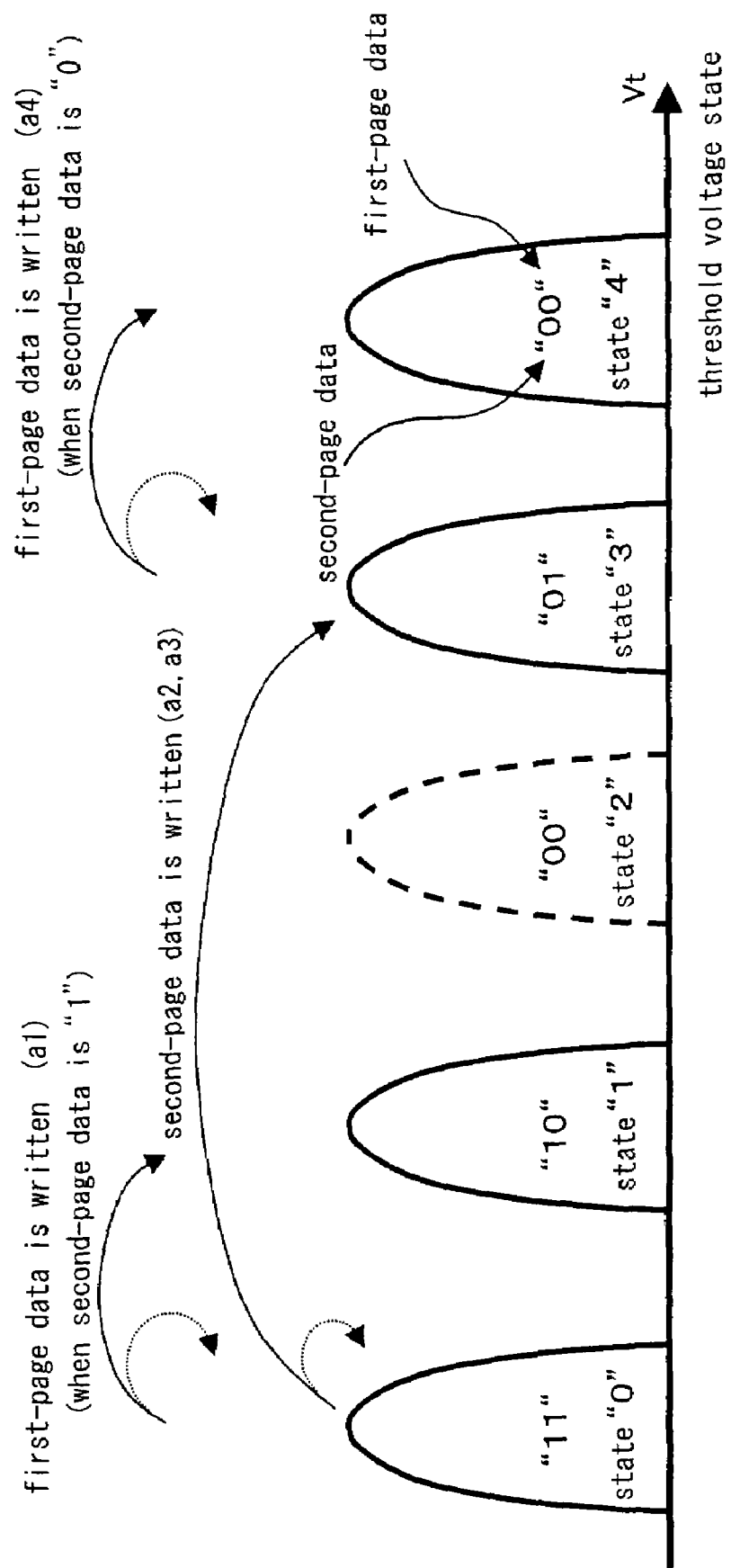
FIG. 2 shows shifts of a memory cell threshold voltage in the case that the data is written in a "reverse" writing sequence in the semiconductor memory device according to the preferred embodiment 1.

Hereinafter, preferred embodiments of a semiconductor memory device according to the present invention are described referring to the drawings. A technical scope of the present invention is not necessarily limited by the embodiments described below.

Preferred Embodiment 1

Figure 21:
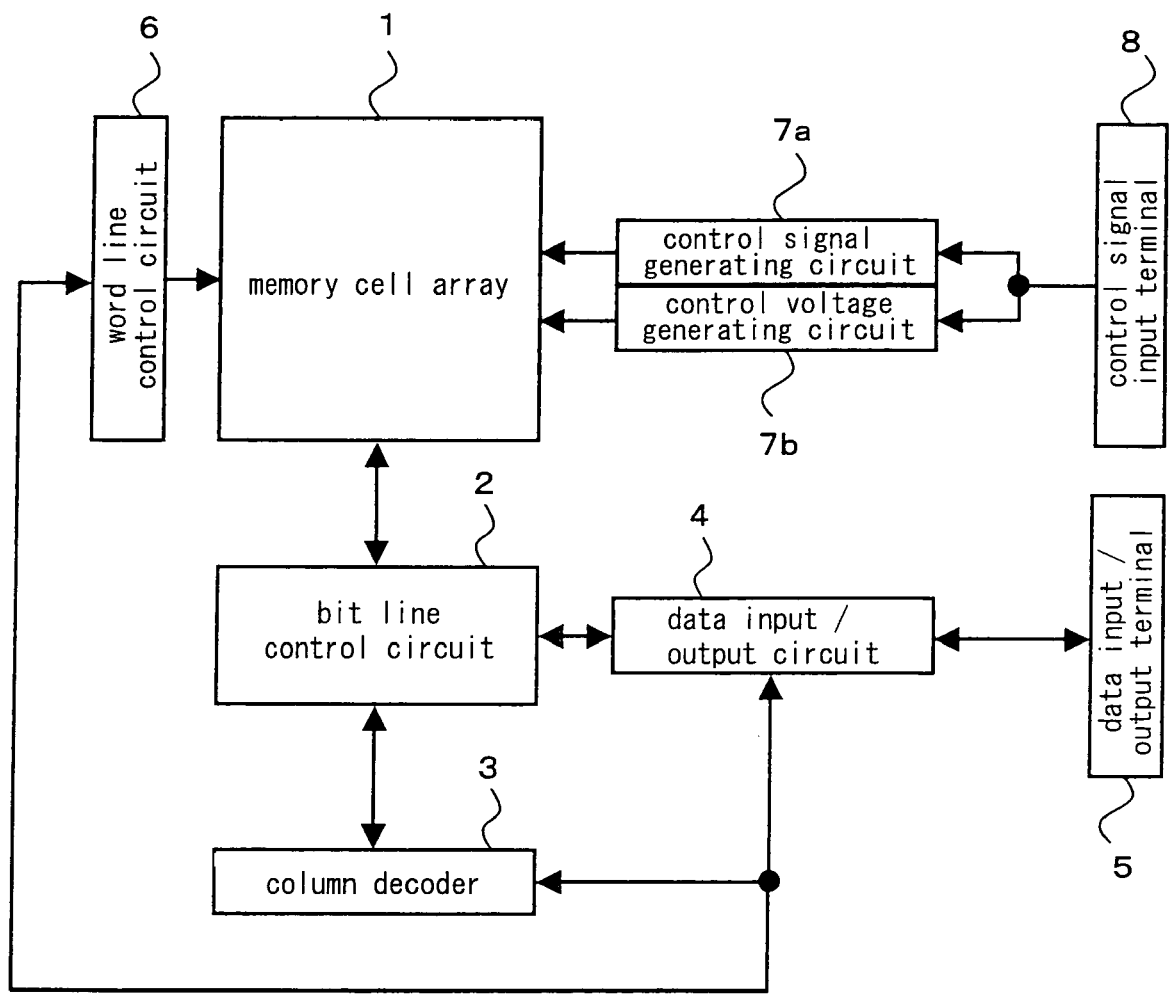
FIG. 21 is a block diagram illustrating a constitution of a semiconductor memory device according to a conventional technology.

Referring to a block diagram shown in FIG. 1 which illustrates a constitution of a semiconductor memory device according to a preferred embodiment 1 of the present invention, operations of respective components are described. In FIG. 1, E1 denotes a controlling unit, and E2 denotes a flag memory unit. The controlling unit E1 comprises a bit line control circuit 2, a column decoder 3, a data input/output circuit 4, a word line control circuit 6, a control signal generating circuit 7a, a control voltage generating circuit 7b, a word line flag control circuit 10 and a word line state control circuit 11. The word line flag control circuit 10 corresponds to a word line flag memory unit in which a flag data is memorized ch the fourth, third and first judgment levels are used (S506, S507 and Sfor each word line. The flag memory unit E2 is comprised of a non-volatile memory circuit 9. Any other component, which is same as that of the conventional technology shown in FIG. 21, is simply provided with the same reference and not described in detail again.

The non-volatile memory circuit 9 memorizes a writing state data Da for each word line and a flag data Fw for each word line when a data in a second data is written prior to a data in a first page.

The word line flag control circuit 10 controls the writing of the flag data Fw of each word line to the non-volatile memory circuit 9 by performing the processing wherein the word line flag control circuit 10 reads the flag data Fw of each word line from the non-volatile memory circuit 9, supplies the flag data Fw of each word line to word line control circuit 6 and the bit line control circuit 2, and discriminates a sequence of pages in a writing operation in order to update the flag data Fw of each word line. The flag data Fw of each wordline is defined as "0" when the data is written in a "forward" (first page→second page) writing sequence, while being defined as "1" when the data is written in a "reverse" (second page→first page) writing sequence.

The word line state control circuit 11 reads the writing state data Da of each word line from the non-volatile memory circuit 9 and supplies the writing state data Da to the word line control circuit 6. The word line state control circuit 11 updates the writing state data Da based on the writing page inputted thereto, and performs the writing control of the writing state data Da to the non-volatile memory circuit 9.

The writing state data Da is a data showing whether the data in the first page has been written or the data in the second page has been written.

Figure 22:
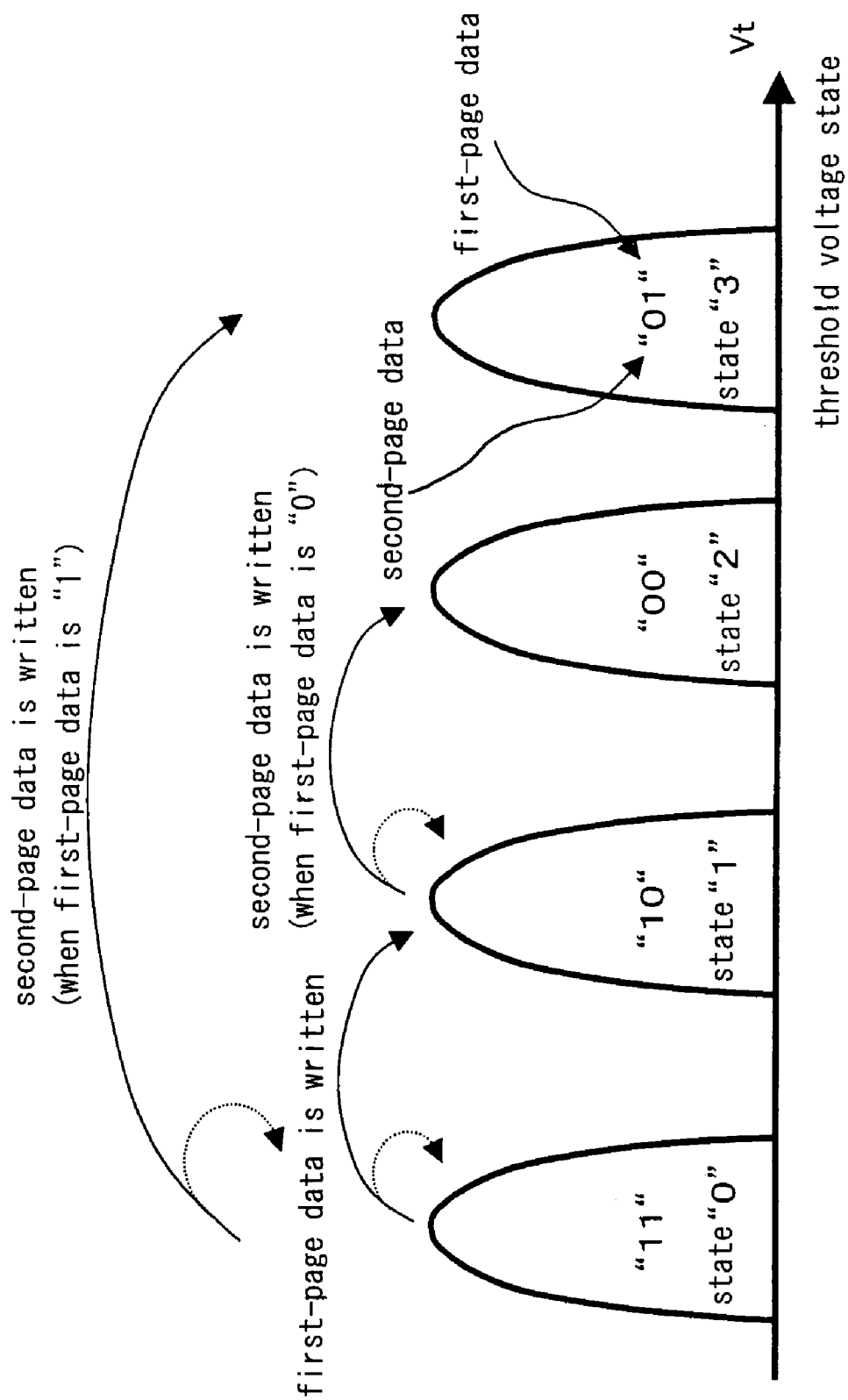
FIG. 22 shows shifts of a memory cell threshold voltage in a writing operation in the semiconductor memory device according to the conventional technology.

A state of the memory cell shifts in the same manner as in the conventional technology shown in FIG. 22 in case that the data is written in the "forward" (first page→second page) writing sequence.

When the data in the first page is written in the "forward" (first page→second page) writing sequence in an erased state, that is in the state "0" of the memory cell, the state of the memory cell shifts to "0" (write data "1") or "1" (write data "0").

A threshold voltage of the memory cell shifts respectively as follows in accordance with the written data when the data in the second page is written.

In case that the data in the second and first pages are "11"state "0"→state. "0"

In case that the data in the second and first pages are "10"state "0"→state "1"

In case that the data in the second and first pages are "01"state "0"→state "3"

In case that the data in the second and first pages are "00"state "1"→state "2"

More specifically, the threshold voltage of the memory cell after the writing operation is executed in the "forward" writing sequence results in any of the state "0", state "1", state "2" and state "3" in a manner similar to that of the conventional technology.

In the writing operation in the "forward" direction, the threshold voltage in the preceding page (first page) is "0" (data "11") and "1" (data "10"). The threshold voltage in the subsequent page (second page) is "0" (data "11"), "1" (data "10"), "2" (data "00") and "3" (data "01"). The shifts to these states are described in detail below.

When the data in the subsequent page (second page) is written after the data in the preceding page (first page) is written at the threshold voltage "0", the threshold voltage "0" is used when the data is not changed, while the threshold voltage "3" is used when the data is changed. More specifically, the threshold voltage shifts in such a manner as state "0"→state "0" and state "0"→state "3", and the threshold voltage does not happen to turn back.

When the data in the subsequent page (second page) is written after the data in the preceding page (first page) is written at the threshold voltage "1", the threshold voltage "1" is used when the data is not changed, while the threshold voltage "2" is used when the data is changed. More specifically, the threshold voltage shifts in such a manner as state "1"→state "1" and state "1"→state "2", and the threshold voltage does not happen to turn back. In any case, the shift of the threshold voltage is not an obstacle in the writing operation in the "forward" writing sequence.

FIG. 2 shows shifts of the state of the memory cell when the data is written in the "reverse" (second page→first page) writing sequence. The state of the memory cell after the data in the second page is written in the "reverse" writing sequence in the erased state, that is, in the "0" state of the memory cell, is "0" when the write data is "1", and "3" when the write data is "0". The threshold voltage of the memory cell shifts as follows in accordance with the written data when the data in the first page is written.

In case that the data in the second and first pages are "11" state "0"→state "0"

In case that the data in the second and first pages are "10": state "0"→state "1"

In case that the data in the second and first pages are "01" state "3"→state "3"

In case that the data in the second and first pages are "00" state "3"→state "4"

More specifically, the threshold voltage of the memory cell after the writing operation is executed in the "reverse" writing sequence results in any of the state "0", state "1", state "3" and state "4".

In the writing operation in the "reverse" direction, the states of threshold voltage in the preceding page (second page) are "0" (data "11") and "3" (data "01"). The states of threshold voltage in the subsequent page (first page) are "0" (data "11"), "1" (data "10"), "3" (data "01") and "4" (data "00"). These shifts of the states are described in detail below.

When the data in the subsequent page (first page) is written after the data in the preceding page (second page) is written at the threshold voltage "0", the threshold voltage "0" is used when the data is not changed, while the threshold voltage "1" is used when the data is changed. More specifically, the threshold voltage shifts in such a manner as state "0"→state "0" and state "0"→state "1", and the threshold voltage does not happen to turn back.

When the data in the subsequent page (first page) is written after the data in the preceding page (second page) is written at the threshold voltage "3", the threshold voltage "3" is used when the data is not changed, while the threshold voltage "4" is used when the data is changed. More specifically, the threshold voltage shifts in such a manner as state "3"→ state "3" and state "3"→state "4", and the threshold voltage does not happen to turn back. In any case, the shift of the threshold voltage is not an obstacle in the writing operation in the "reverse" writing sequence in a manner similar to the writing operation in the "forward" writing sequence.

As described, according to the semiconductor memory device of the present preferred embodiment, the multiple-value data can be written in the memory cell array at the random addresses in either of the writing operations in the "forward" and "reverse" writing sequences.

Figure 3:
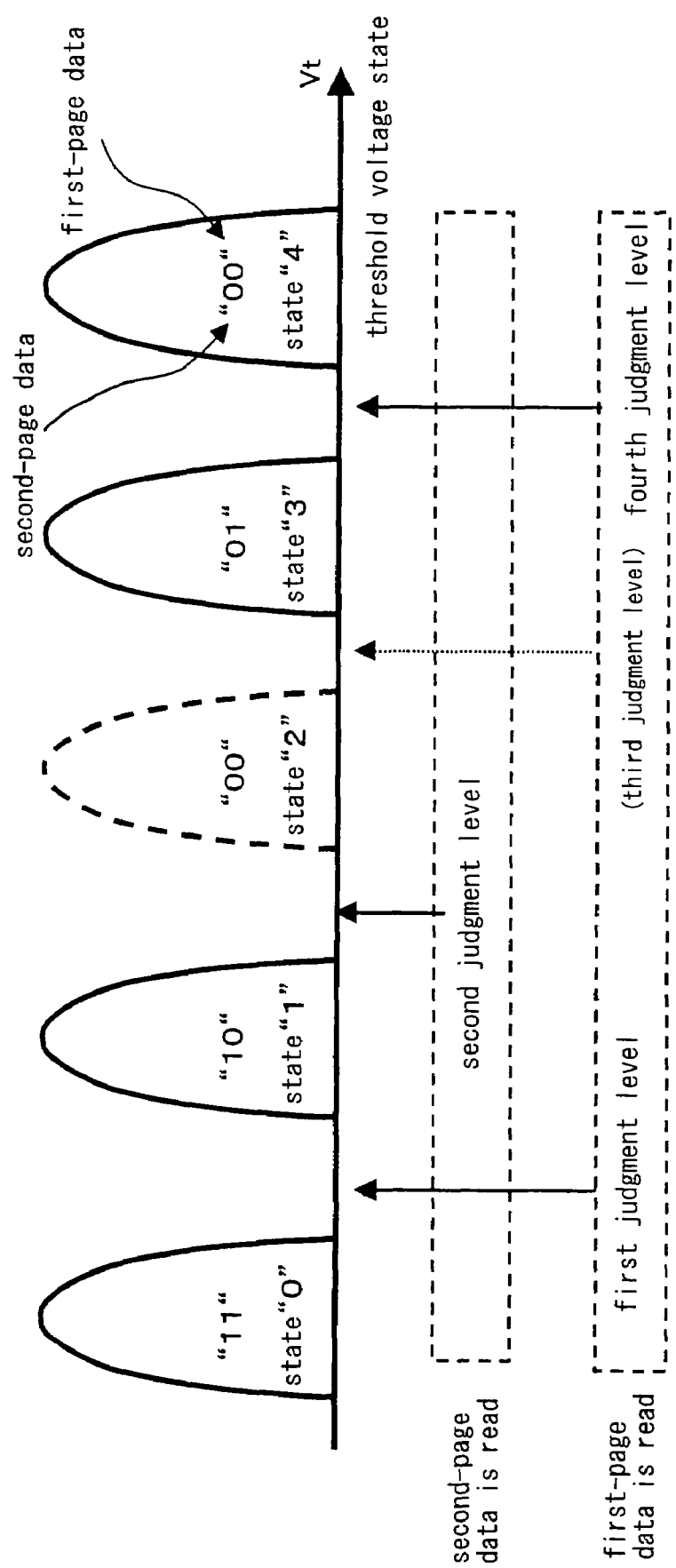
FIG. 3 is a conceptual view of a reading operation in the case that the data is written in the "reverse" writing sequence in the semiconductor memory device according to the preferred embodiment 1.

FIG. 3 shows a data reading method in the case that the data is written in the "reverse" writing sequence in the preferred embodiment 1.

When the data in the second page is read, the read data is "1" when the memory cell is in the state "0" or "1", while the read data is "0" when the memory cell is in the state "3" or "4". The data can be thus read if it is judged whether the state of the memory cell is in at most the state "1" or at least the state "3", and a word-line voltage in the reading operation may be good to be set to one of a second judgment level which is a voltage between the state "1" and the state "2", or a third judgment level which is a voltage between the state "2" and the state "3".

By setting the word-line voltage to the second judgment level, the data can be read as in case that the data in the second page is conventionally read. Thereby, a circuit configuration of the word line control circuit 6 can be simplified.

Next, when the data in the first page is read, the read data is "1" when the memory cell is in the state "0" or "3", while the read data is "0" when the memory cell is in the state "1" or "4". Therefore, it is necessary to judge whether the data in the first page is in either of the state "0", state "1", state "3" or state "4".

The data in the first page is read based on a result of the following judgment treatments three times as total to the word-line voltage in the reading operation.

a voltage judgment processing based on a first judgment level which is a voltage between "0" and "1"

a voltage judgment processing based on the third judgment level which is the voltage between "2" and "3"

a voltage judgment processing based on a fourth judgment level which is a voltage between "3" and "4"

Figure 23:
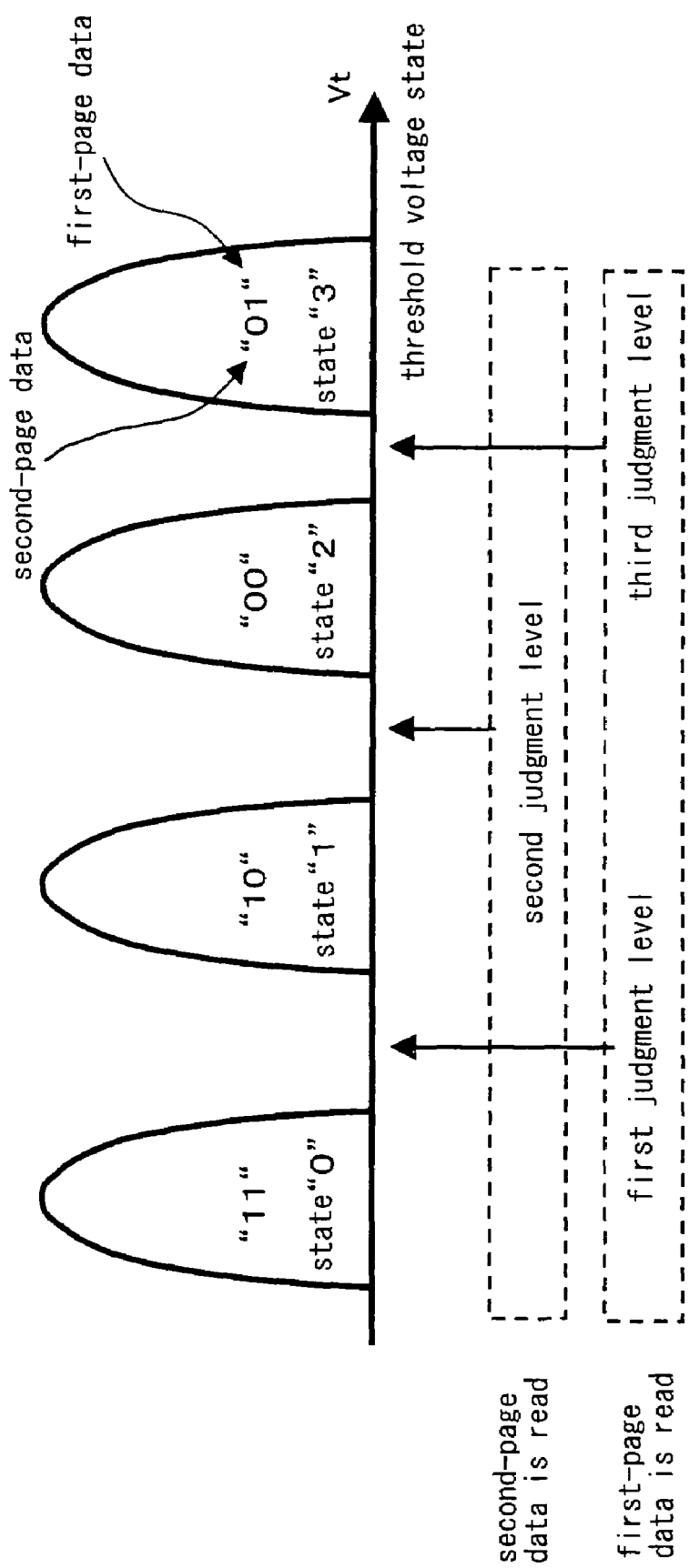
FIG. 23 is a conceptual view of a reading operation in the semiconductor memory device according to the conventional technology

A data reading method in a state that the data is written in the "forward" direction, first page→second page, is similar to that of the conventional technology shown in FIG. 23, and therefore, it is not described again.

Figure 4:
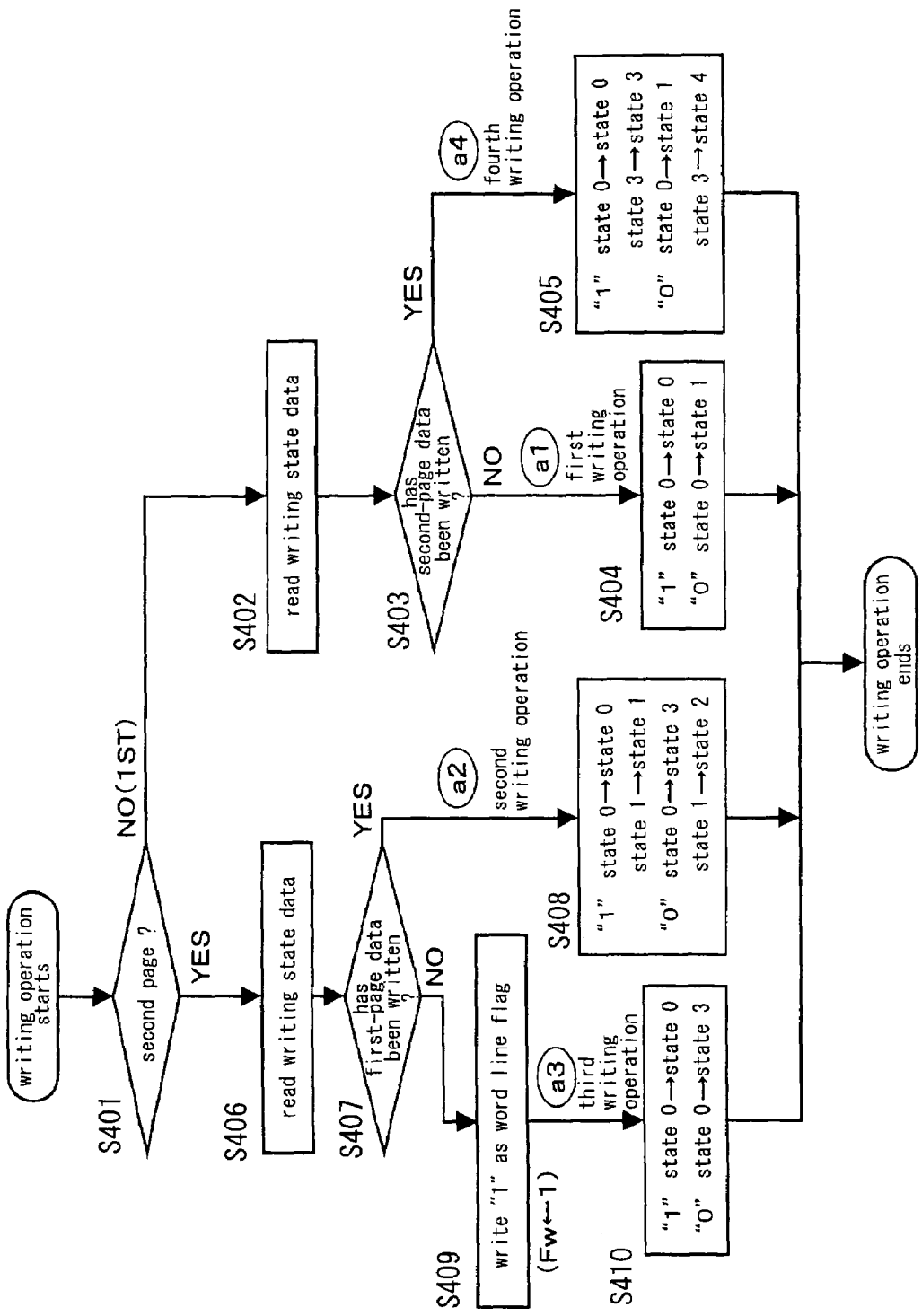
FIG. 4 is a flow chart of the writing operation in the semiconductor memory device according to the preferred embodiment 1.
Figure 5:
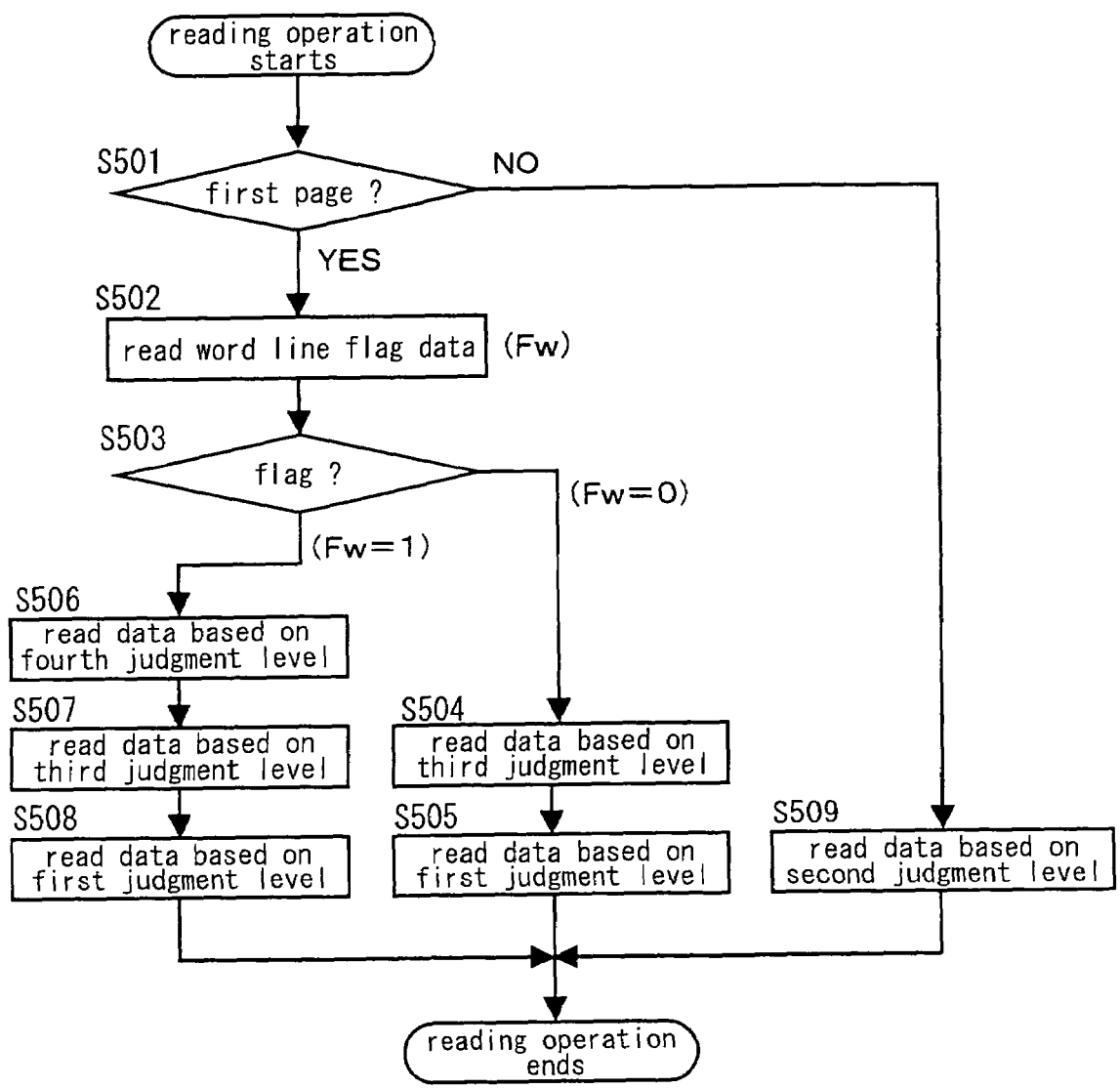
FIG. 5 is a flow chart of the reading operation in the semiconductor memory device according to the preferred embodiment 1.

The data writing operation and the data reading operation to the memory cell array 1 are described referring to FIGS. 4 and 5.

Writing Operation

When the writing operation is initiated and the page to be written is designated from outside, it is judged whether or not the designated page is the first page (S401). The writing operations are different depending on results of the judgment in S401, which are separately described based on the judgment results (first page and second page).

The case wherein the judgment result shows that the current writing page is the first page The word line state control circuit 11 in the control unit E1 reads the writing state data Da from the non-volatile memory circuit 9 (S402). Next, it is judged from the read writing state data Da whether or not the data in the second page has been written (S403). When it is judged in S403 that the data in the second page has not been written, it is judged that the current writing operation is the writing operation in the "forward" writing sequence, and the current writing operation where the data in the first page is written is a first-half part of the writing operation.

Based on the foregoing judgment, the state of the memory cell is shifted to "0" or "1" in accordance with the write data in the first page (S404). Thus, the current writing operation in which the data in the first page is written is processed as a first-half writing operation (hereinafter, referred to as a first writing operation) a1 in the writing operation in the "forward" writing sequence (first page→second page)

At the same time, when it is judged in S403 that the data in the second page has been written, the state of the memory cell is shifted to "0", "1", "3" or "4" in accordance with the write data as shown in FIG. 2 (S405). Thus, the current writing operation in which the data in the first page is written is processed as a latter-half writing operation (hereinafter, referred to as a fourth writing operation) a4 in the writing operation in the "reverse" writing sequence (second page→first page).

The case that the judgment result shows the current writing page is the second page The word line state control circuit 11 reads the writing state data Da from the non-volatile memory circuit 9 (S406). Next, it is judged from the read writing state data Da whether or not the data in the first page has been written (S407). When it is judged in S407 that the data in the first page has been written, the state of the memory cell is shifted to "0", "1", "2" or "3" in accordance with the write data in the first page in the conventional manner (S408). Thus, the current writing operation in which the data in the second page is written is processed as a latter-half writing operation (hereinafter, referred to as a second writing operation) a2 in the writing operation in the "forward" writing sequence (first page→second page).

Meanwhile, when it is judged in S407 that the data in the first page has not been written, it is judged that the current writing operation is the writing operation in the "reverse" writing sequence. Based on the judgment, "1" is written in the non-volatile memory circuit 9 as the flag data Fw of each word line by the word line flag control circuit 10 (S409). Thereby, the memory cell of the memory cell array 1 is shifted to the state "0" or the state "3" in accordance with the write data as shown in FIG. 2 (S410). Thus, the current writing operation in which the data in the second page is written is processed as a first-half writing operation (hereinafter, referred to as a third writing operation) a3 in the writing operation in the "reverse" writing sequence (second page→first page).

In the actual processing, the operation is executed as the first writing operation a1→the second writing operation a2 in case of the writing operation in the "forward" writing sequence, while the operation is executed as the third writing operation a3→the fourth writing operation a4 in case of the writing operation in the "reverse" writing sequence.

Reading Operation

When the reading operation is commenced, and the page to be read is designated from outside, it is judged whether or not the designated page is the first page (S501). There are different reading operations depending on results of the judgment in S501, which are separately described based on the judgment results (first page and second page).

The case that the judgment result shows the current reading page is the first page The word line flag control circuit 10 in the control unit E1 reads the flag data Fw of each word line from the non-volatile memory circuit 9 (S502). Next, the word line flag data Fw thus read is judged (S503). When it is judged in S503 that the word line flag data Fw is "0", it is judged that the current reading operation is the reading operation of the data written in the "forward" writing sequence. In this case, the memory cell is in any of the state "0", state "1", state "2" and state "3" just like the conventional technology shown in FIG. 23. Therefore, the data is read based on the level judgments twice as total for the threshold voltage of the memory cell in which the third and first judgment levels are used (S504 and S505). This is the reading operation of the first page of the data written in the "forward" writing sequence.

When the word line flag data Fw is judged to be "1" in S503, it is judged that the current reading operation is the reading operation of the data written in the "reverse" writing. In this case, the memory cell array 1 is in any of the state "0", state "1", state "3" and state "4". Therefore, as shown in FIG. 3, the data is read based on the level judgments three times as total for the threshold voltage of the memory cell in whi508). This is the reading operation of the first page of the data written in the "reverse" writing sequence is thus read.

When the threshold voltage of the memory cell is judged to be larger than the first judgment level in the level judgment in S508, the memory cell is in the state "1" or in the state "3" as shown in FIG. 3, and the data in the first page is respectively "0" and "1". Therefore, the third judgment level is necessary for discriminating the data in the first page. The judgment level shifts in the descending order, however, may be shifted in the ascending order. When the data is read, there is no shift of the threshold state, and a shift direction of the judgment level is random.

The case that the judgment result shows the current reading page is the second page In this case, the reading operation does not depend on the word line flag data Fw. Therefore, the data is read by judging the threshold voltage of the memory cell based on the second judgment level as shown in FIGS. 3 and 23 (S509). It can be applied to the reading operation of the data written both in the "forward" writing sequence and the data written in the "reverse" writing sequences.

As described, according to the preferred embodiment 1, the data can be memorized as the multiple-value data without any restriction to the writing sequences of data in the first and second pages.

Preferred Embodiment 2

Figure 6:
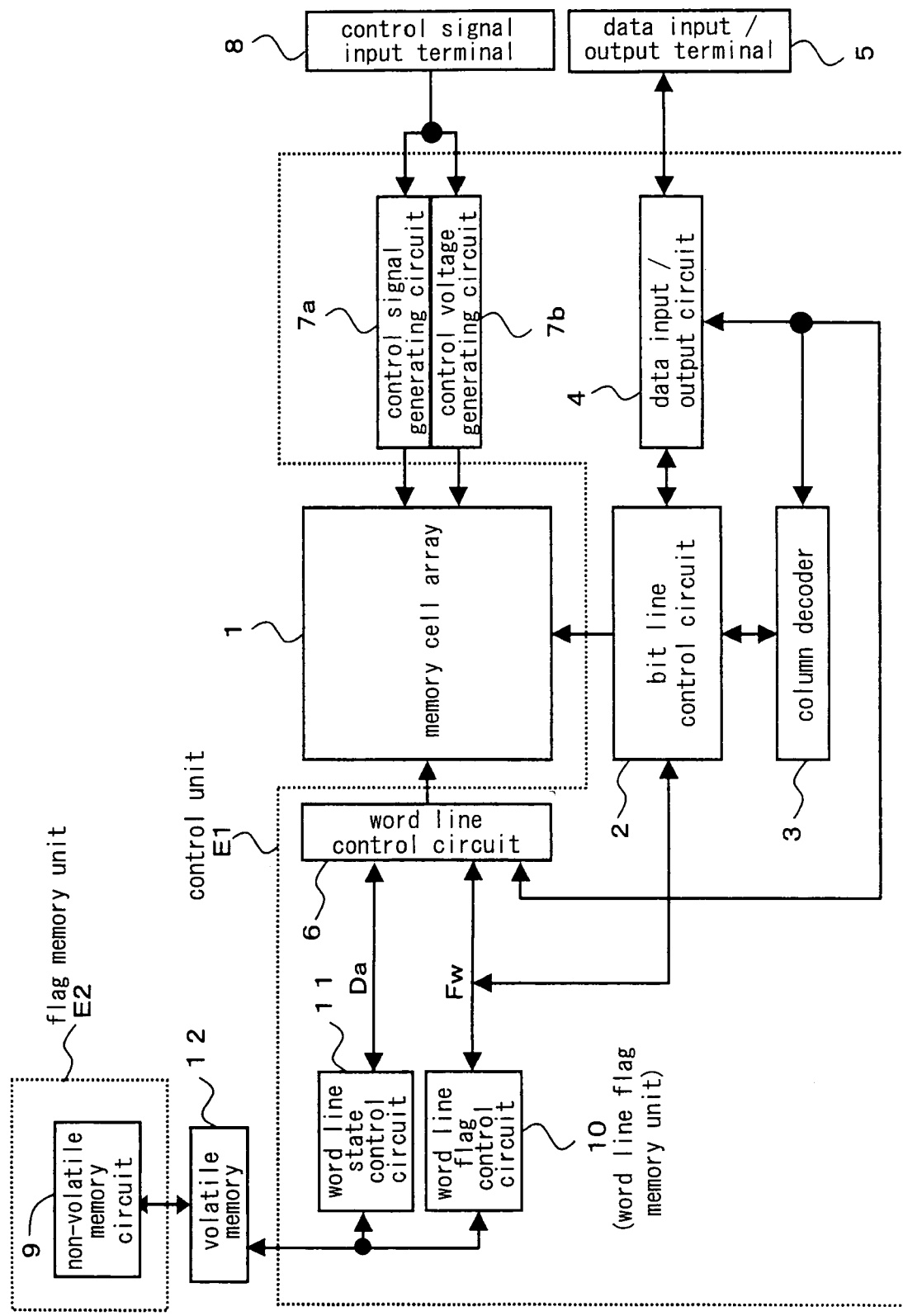
FIG. 6 is a block diagram illustrating a constitution of a semiconductor memory device according to a preferred embodiment 2 of the present invention.

A preferred embodiment 2 of the present invention is described referring to a block diagram illustrating a constitution of a semiconductor memory device shown in FIG. 6. The preferred embodiment 2 is different from the preferred embodiment 1 (FIG. 1) in that a volatile memory 12 is provided. The volatile memory 12 is connected to the flag memory unit E2 (non-volatile memory circuit 9) and the control unit E1. The volatile memory 12 is provided between the memory unit E2 and the control unit E1, and transmits and receives writing state data Da and the flag data Fw. In general, a processing speed of the non-volatile memory circuit 9 is slow in the writing and reading operations, while the volatile memory 12 comprising a CMOS circuit is capable of reading and writing the data at a high speed. Therefore, the writing and reading operations executed to the non-volatile memory circuit 9 when the data is written and read to the memory cell array 1 in the preferred embodiment 1, is carried out to the volatile memory 12, so that the processing speed can be improved. Any other component, which is similar to that of the preferred embodiment 1 shown in FIG. 1, is simply provided with the same reference and not described in detail again.

Figure 7:
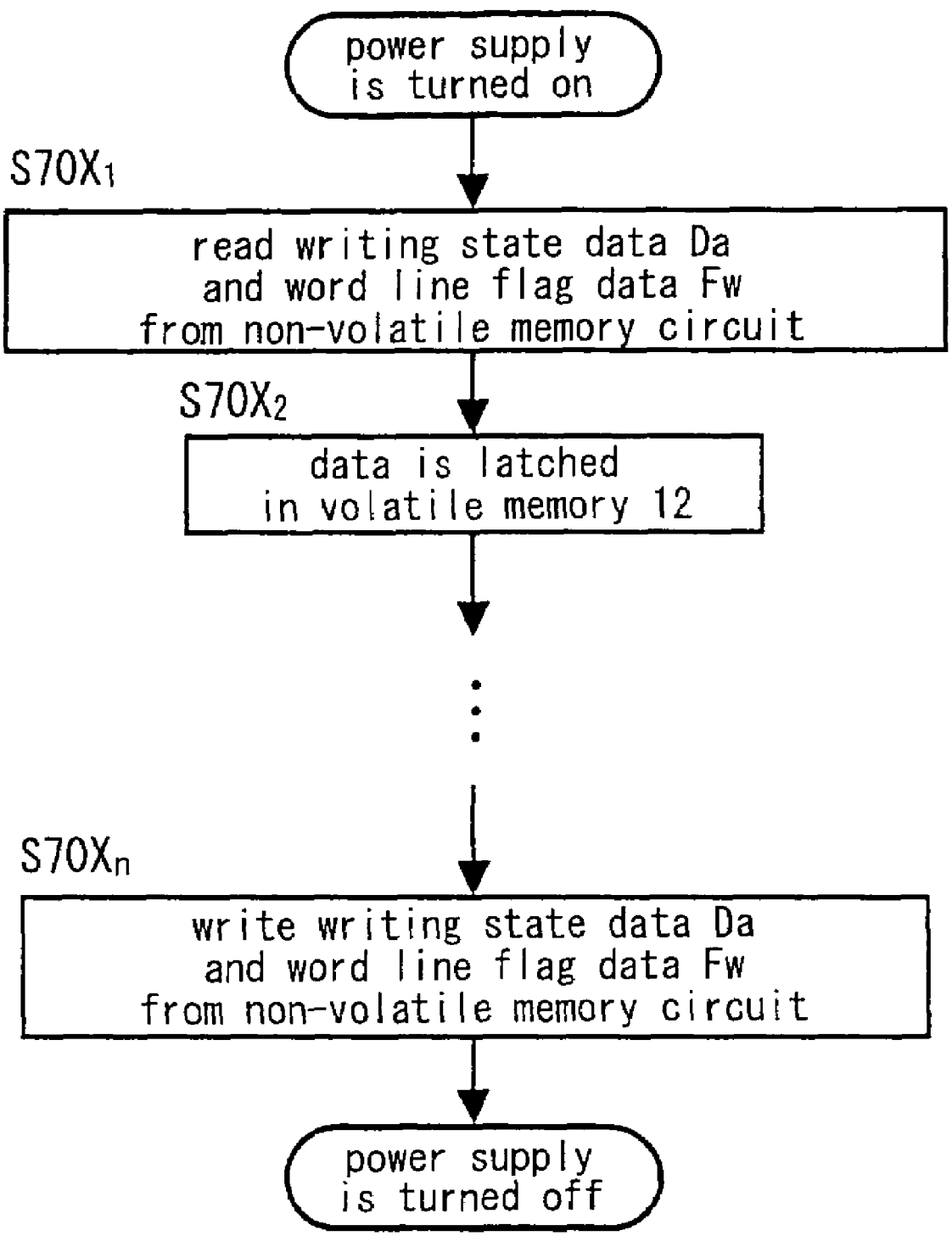
FIG. 7 is a flow chart of data transmitting operations in a volatile memory and a non-volatile memory circuit in the semiconductor memory device according to the preferred embodiment 2.

FIG. 7 shows an example of data transmission and reception between the volatile memory 12 and the non-volatile memory circuit 9. When a power supply is turned on, the writing state data Da and the flag data Fw are read from the non-volatile memory circuit 9 and stored in the volatile memory 12 ($S70X_1$ and $S70X_2$). Immediately before the power supply is turned off, the writing state data Da and the flag data Fw are read from the volatile memory 12 and written in the non-volatile memory circuit 9 ($S70X_n$).

As described, the writing and reading operations can be achieved at a high speed in the preferred embodiment 2.

Preferred Embodiment 3

Figure 8:
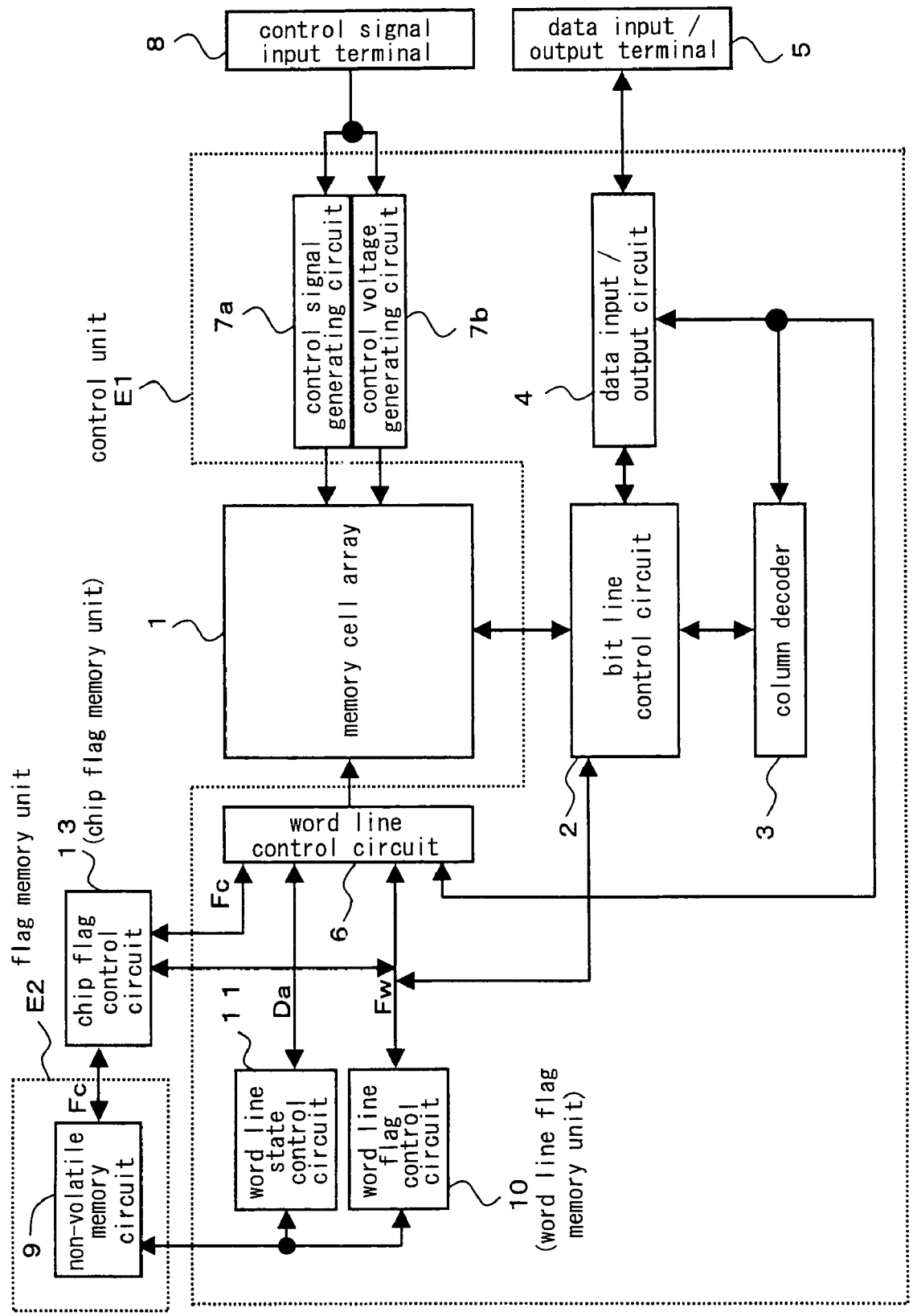
FIG. 8 is a block diagram illustrating a constitution of a semiconductor memory device according to a preferred embodiment 3 of the present invention.

A preferred embodiment 3 of the present invention is described referring to a block diagram illustrating a constitution of a semiconductor memory device shown in FIG. 8. The preferred embodiment 3 (FIG. 8) is different from the preferred embodiment 1 (FIG. 1) in that a chip flag control circuit 13 is provided.

The chip flag control circuit 13 reads a chip flag data Fc from the non-volatile memory circuit 9 and supplies the read data Fc to the word line control circuit 6. The chip flag control circuit 13 further obtains the flag data Pw of each word line from the word line flag control circuit 10 and a word line state data from the word line state control circuit 11, and judges if it is necessary to update the flag data Fc of each chip. The chip flag control circuit 13 writes the updated flag data Fc of each chip in the non-volatile memory circuit 9. The chip flag control circuit 13 corresponds to a chip flag memory unit for managing a state of the flag data in each of the entire word lines. Any other component, which is similar to that of the preferred embodiment 1 shown in FIG. 1, is simply provided with the same reference and not described in detail again. As well, "each chip" recited in the description means that the memory cell array 1 is regarded as one unit.

Figure 9:
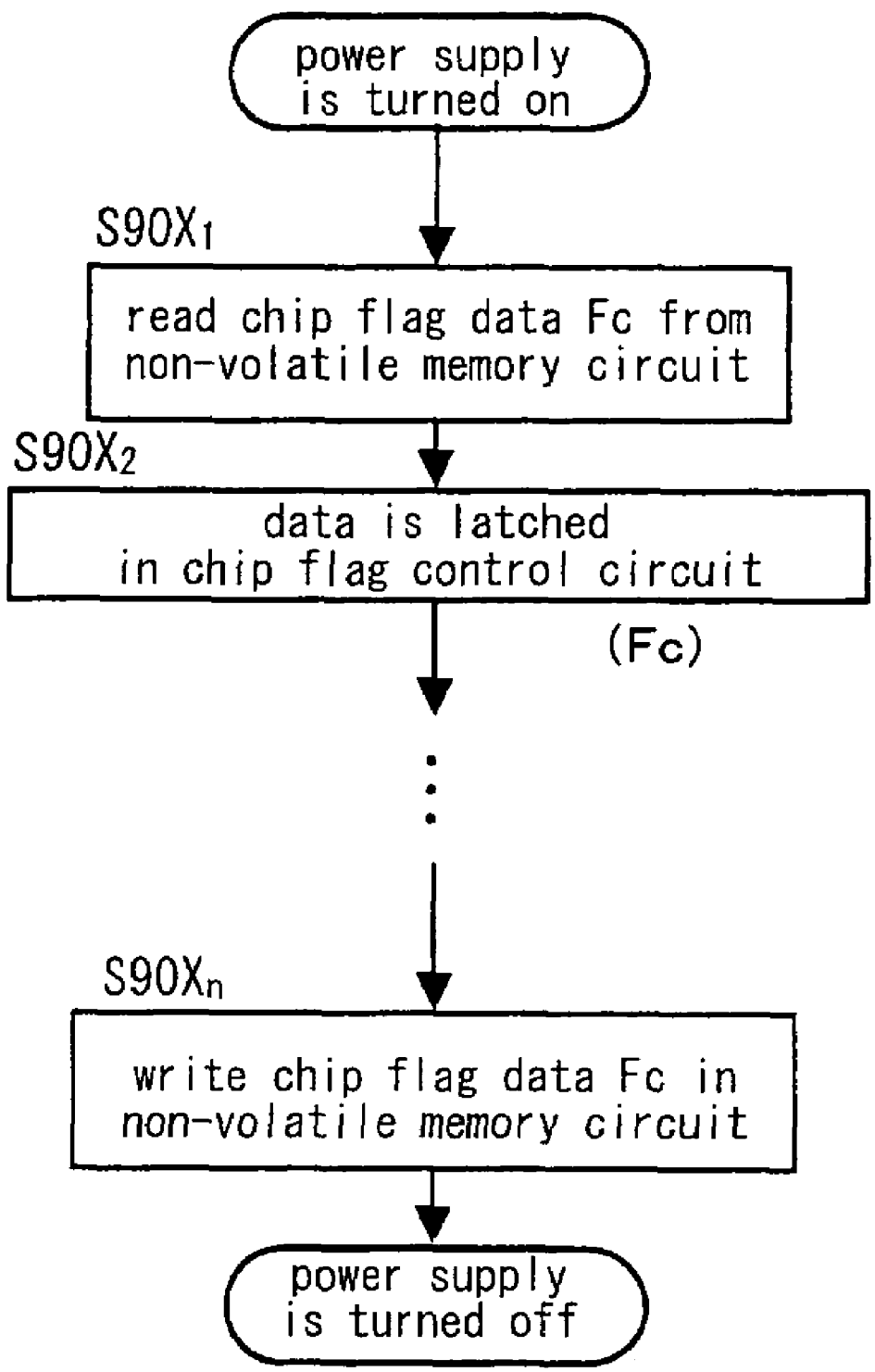
FIG. 9 is a flow chart of data transmitting operations in a volatile memory and a non-volatile memory circuit in the semiconductor memory device according to the preferred embodiment 3.

FIG. 9 shows an example of data transmission and reception between the chip flag control circuit 13 and the non-volatile memory circuit 9. When the power supply is turned on, the chip flag data Fc is read from the non-volatile memory circuit 9 and supplied to the chip flag control circuit 13 ($S90X_1$ and $S90X_2$). In addition, immediately before the power supply is turned off, the chip flag data Fc is read from the chip flag control circuit 13 and written in the non-volatile memory circuit 9.

Figure 10:
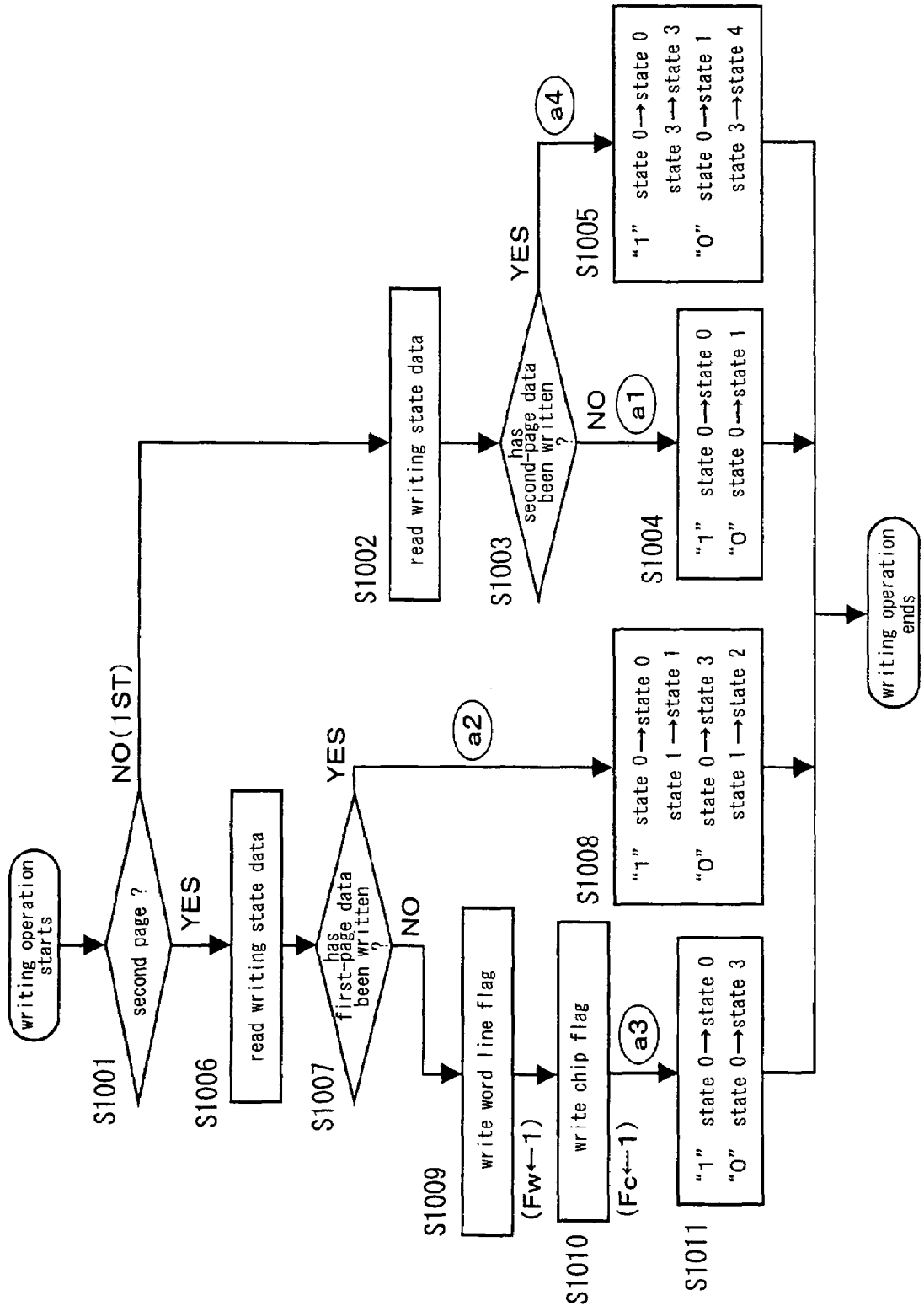
FIG. 10 is a flow chart of a writing operation in the semiconductor memory device according to the preferred embodiment 3.
Figure 11:
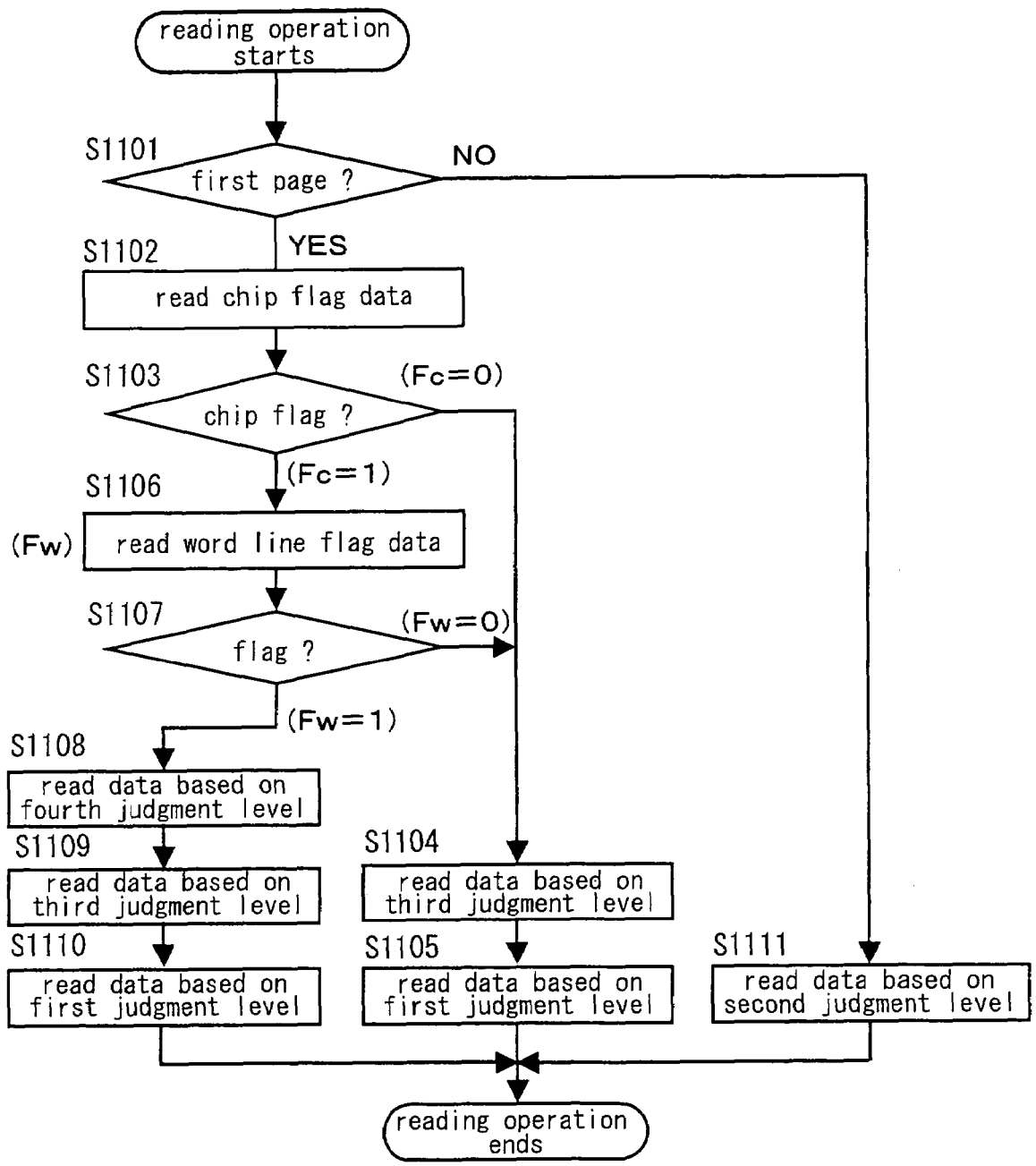
FIG. 11 is a flow chart of a reading operation in the semiconductor memory device according to the preferred embodiment 3.

The data writing operation and the data reading operation to the memory cell array 1 are described referring to FIGS. 10 and 11.

Writing Operation

When the writing operation is commenced and the page to be written is designated from outside, it is judged whether or not the designated page is the second page (S1001). The writing operation is different depending on results of the judgment in S1001. The writing operations are separately described below based on the judgment results (first page and second page).

The case that the judgment result shows the current writing page is the first page The word line state control circuit 11 reads the writing state data Da from the non-volatile memory circuit 9 (S1002). Next, it is judged from the writing state data Da thus read whether or not the data in the second page has been written (S1003). When it is judged in S1003 that the data in the second page has not been written in S1003, the current writing operation is judged to be the writing operation in the first page located in a first-half part of the writing operation in the "forward" (first page→second page) writing sequence.

Based on the foregoing judgment, the state of the memory cell is rendered "0" or "1" in accordance with the write data in the first page (S1004). Thus, the writing operation in the first page is processed as the first-half writing operation (first writing operation) a1 in the writing operation in the "forward" (first page→second page) writing sequence.

When it is judged in S1003 that the data in the second page has been written, the current writing operation is the writing operation in the first page located in a latter-half part of the writing operation in the "reverse" writing sequence.

Based on the foregoing judgment, the state of the memory cells is made "0", "1", "3" or "4" in accordance with the write data (S1005). Thus, the writing operation in the first page is processed as the writing operation (fourth writing operation) a4 in a latter-half part of the writing operation in the "reverse" writing sequence.

As described, the processing similar to that of the preferred embodiment 1 is executed in the case that the page designated from outside is the first page.

The case that the judgment result shows the current writing page is the second page The word line state control circuit 11 reads the writing state data Da from the non-volatile memory circuit 9 (S1006). Then, it is judged from the writing state data Da thus read whether or not the data in the first page has been written (S1007). When it is judged in S1007 that the data in the first page has been written, the current writing operation is judged to be the writing operation in the second page located in a latter-half part of the writing operation in the "forward" writing sequence.

Based on the foregoing judgment, the state of the memory cell is made "0", "1", "2" or "3" in accordance with the write data in the second page (S1008). Thus, the writing operation in the second page is processed as the writing operation in a latter-half (second writing operation) a2 in the writing operation in the "forward" writing sequence.

When it is judged in S1007 that the data in the first page has not been written, the current writing operation is judged to be the writing operation in which the data in the second page is written corresponding to a first-half part of the writing operation in the "reverse" writing sequence.

Based on the foregoing judgment, "1" is written as the flag data Fw of each word line in the non-volatile memory circuit 9 by the word line flag control circuit 10 (S1009). Further, the chip flag control circuit 13 writes "1" as the chip flag data Fc in the non-volatile memory circuit 9 (S1010). "1" in the chip flag data Fc denotes the writing operation in the reverse writing sequence. The chip flag data Fc, except updating to "1" in S1010, remains "0" (which denote the writing operation in the forward writing sequence).

Then, the memory cell of the memory cell array 1 is made "0" or "3" in accordance with the write data (S1001). Thus, the writing operation in which the data in the second page is written is processed as the writing operation in a first-half part (third writing operation) a3 in the writing operation in the "reverse" writing sequence.

Reading Operation

When the reading operation is commenced, and the page to be read is designated from outside, it is judged whether or not the designated page is the first page (S1101). The reading operation is different depending on results of the judgment. The reading operations are separately described below based on the judgment results (first page and second page)

The case that the judgment result shows the current reading page is the first page The chip flag control circuit 13 reads the chip flag data Fc from the non-volatile memory circuit 9 and judges the contents of the data (S1102 and S1103). When it is judged in S1103 that the chip flag data Fc is "0", the data to be read in the current reading operation is judged to be the data written in the "forward" writing sequence.

Based on the foregoing judgment, the state of the memory cells is judged to be any of "0", "1", "2" and "3". Therefore, the data is read from the memory cell based on the level judgments twice as total for the threshold voltage of the memory cell in which the third and first judgment levels are used (S1104 and S1105). This is the reading operation of the first-page in the data all written in the "forward" direction is read.

When it is judged in S1103 that the chip flag data Fc is "1", the data to be read in the current reading operation is judged to include the mixed data written respectively in the "forward" writing sequence and in the "reverse" writing sequence.

Based on the foregoing judgment, it is judged to be further necessary to determine through the writing page sequence for each word line. Based on the judgment, the word line flag control circuit 10 reads the word line flag data Fw from the non-volatile memory circuit 9 and judges the contents of the read data Fw (S1106 and S1107). When it is judged in S1107 that the word line flag data Fw is "0", the current reading operation is judged to be the reading operation of the data written in the "forward" writing sequence, in this case the state of the memory cell is judged to be any of "0", "1", "2" and "3" in a manner similar to the conventional technology shown in FIG. 23. Therefore, the data is read from the memory cell based on the level judgments twice as total of the threshold voltage of the memory cells in which the third and first judgment levels are used (S1104 and S1105). This is the reading operation for reading the first-page data among the data extracted as the data written in the "forward" writing sequence from the data including the mixed data written respectively in the "forward" writing sequence and in the "reverse" writing sequence.

When it is judged in S1103 that the word line flag data Fw is "1", the current reading operation is judge to be the reading operation of the data written in the "reverse" writing sequence, in this case the state of the memory cell array 1 is any of "0" "1", "3" and "4". Therefore, as shown in FIG. 3, the threshold voltage of the memory cell is judged based on the level judgments three times as total in which the fourth, third and first judgment levels are used respectively so that the data is read (S1108, S1109 and S1110) This is the reading operation of the first-page data in the data extracted as the data written in the "reverse" writing sequence from the mixed data including the data written in the "forward" writing sequence and the data written in the "reverse" writing sequence.

When the threshold voltage of the memory cell is judged to be larger than the first judgment level in the level judgment in S1110, the state of the memory cell is "1" or "3" as shown in FIG. 3, in this case the data in the first page is respectively "0" and "1". Therefore, the third judgment level becomes necessary to discriminate the data in the first page.

The case that the judgment result shows the current reading page is the second page In this case, the current reading operation does not depend on the wordline flag data Fw and the chip flag data Fc. Therefore, the data is read by judging the state of the memory cell based on the second judgment level as shown in FIGS. 3 and 23 (S1111).

As described, in the preferred embodiment 3, it is first judged whether or not the data is written in the "forward" writing sequence in the entire chip (memory cell array) based on the chip flag Fc. Thereby, the judgment of the flag data of each word line can be omitted in any chip where the data is entirely written in the "forward" writing sequence. Therefore, the processing speed of the reading operation can be increased by the omission of the processing.

Preferred Embodiment 4

Figure 12:
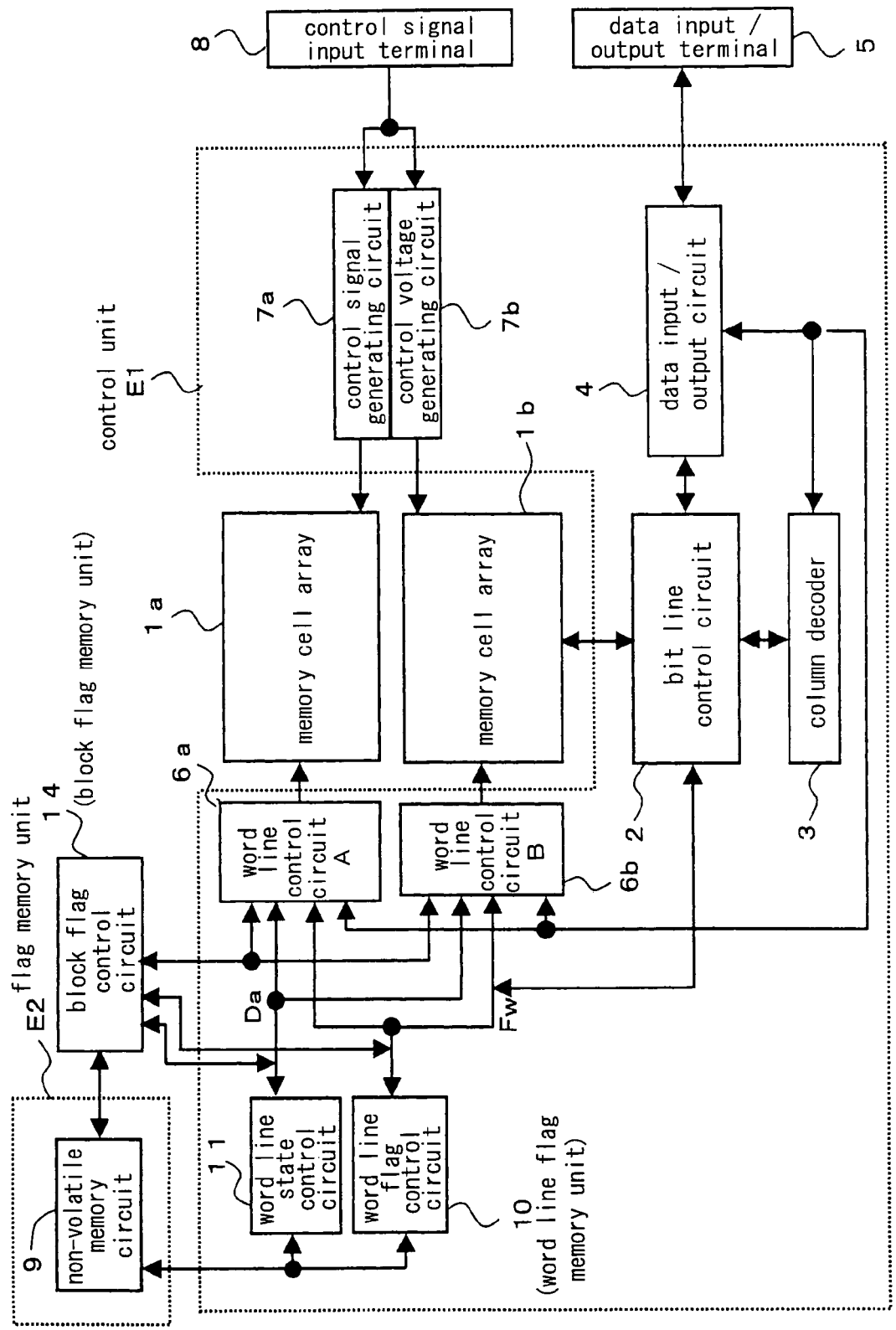
FIG. 12 is a block diagram illustrating a constitution of a semiconductor memory device according to a preferred embodiment 4 of the present invention.

A preferred embodiment 4 of the present invention is described referring to a block diagram illustrating a constitution of a semiconductor memory device shown in FIG. 12. A memory cell array 1a and a memory cell array 1b result from the division of the memory cell array 1 shown in FIG. 8 into two. A word line control circuit 6a and a word line control circuit 6b result from the division of the word line control circuit 6 shown in FIG. 8 into two. The word line control circuit 6a is connected to the memory cell array 1a, while the word line control circuit 6b is connected to the memory cell array 1b.

A block flag control circuit 14 reads a block flag data Fb from the non-volatile memory circuit 9 and supplies the read block flag data Fb to the word line control circuits 6a and 6b. Further, the block flag control circuit 14 obtains the word line flag data Fw from the word line flag control circuit 10 and judges whether or not it is necessary to update the block flag data Fb. Further, the block flag control circuit 14 writes the block flag data Fb in the non-volatile memory circuit 9. The block flag control circuit 14 corresponds to a block flag memory unit for managing the state of the word line flag data for each block containing a plurality of pages as a unit. Any other component, which is similar to that of the preferred embodiment 1 shown in FIG. 1, is simply provided with the same reference number and not described in detail again.

Figure 13:
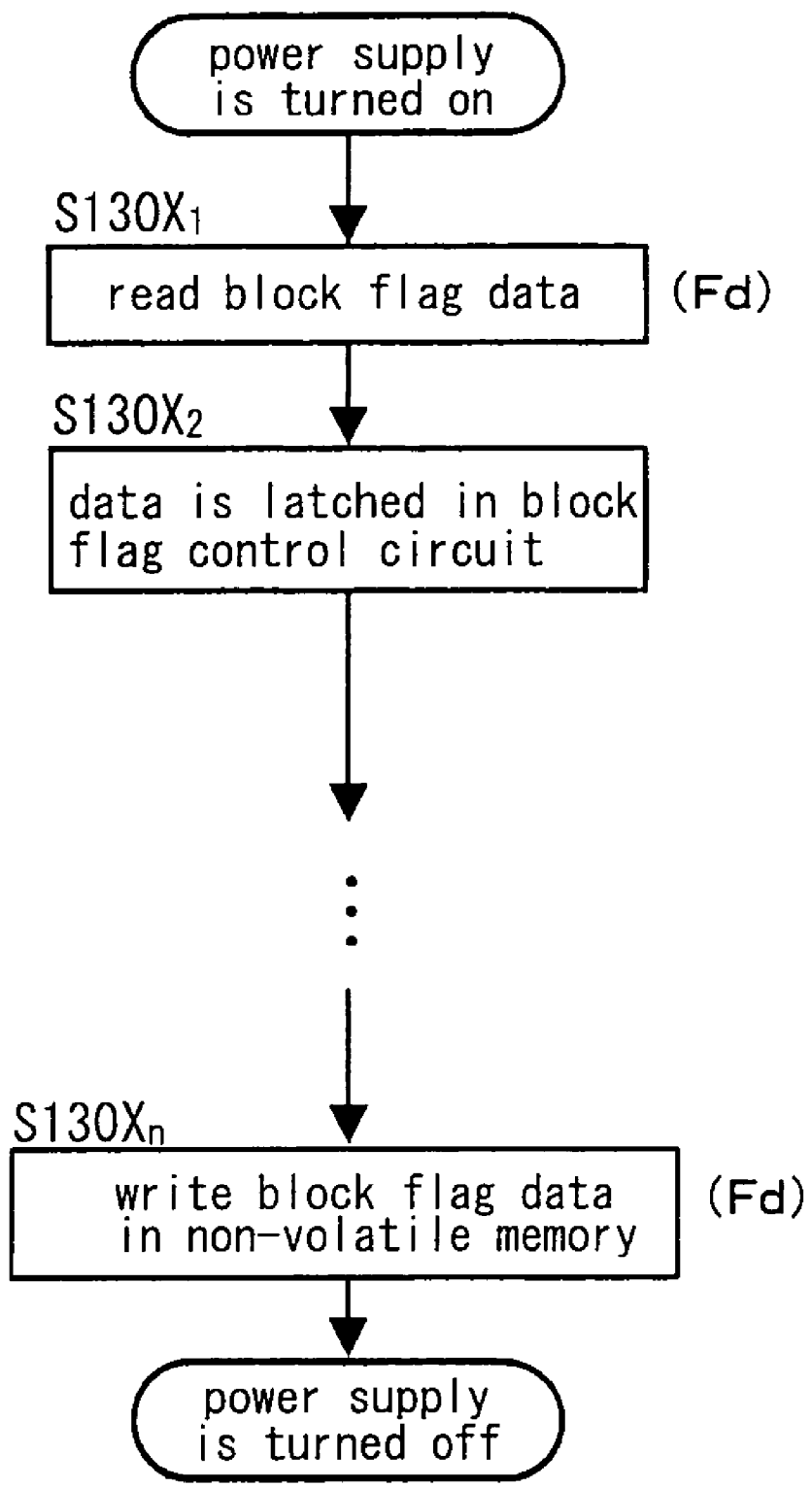
FIG. 13 is a flow chart of data transmitting operations in a volatile memory and a non-volatile memory circuit in the semiconductor memory device according to the preferred embodiment 4.

FIG. 13 shows an example of data transmission and reception between the block flag control circuit 14 and the non-volatile memory circuit 9. When the power supply is turned on, the block flag data Fb is read from the non-volatile memory circuit 9 and stored in the block flag control circuit 14 (S130$X_1$ and S130$X_2$). Immediately before the power supply is turned off, the block flag data Fb is read from the block flag control circuit 14 and written in the non-volatile memory circuit 9 (S130$X_n$).

Figure 14:
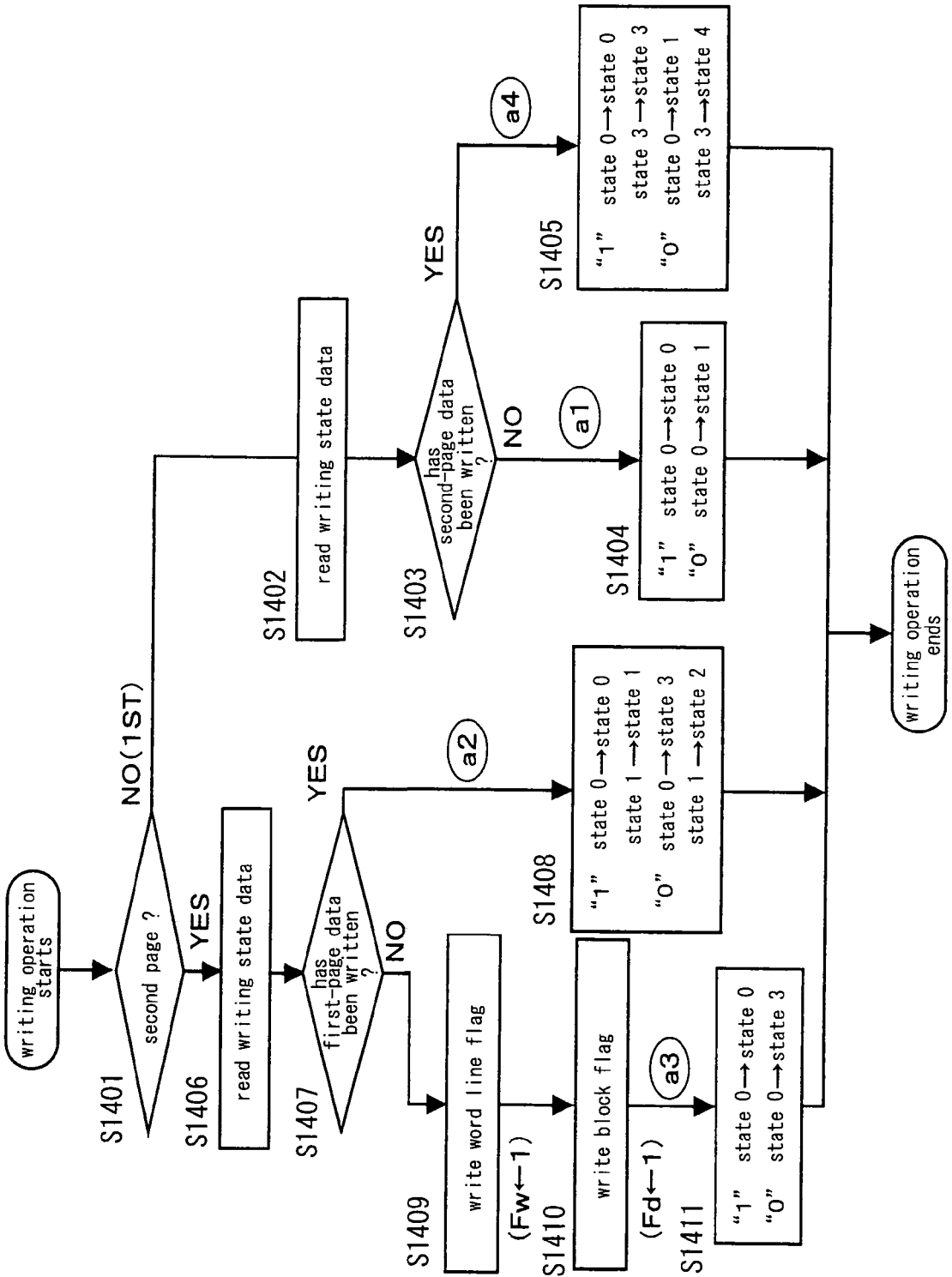
FIG. 14 is a flow chart of a writing operation in the semiconductor memory device according to the preferred embodiment 4.
Figure 15:
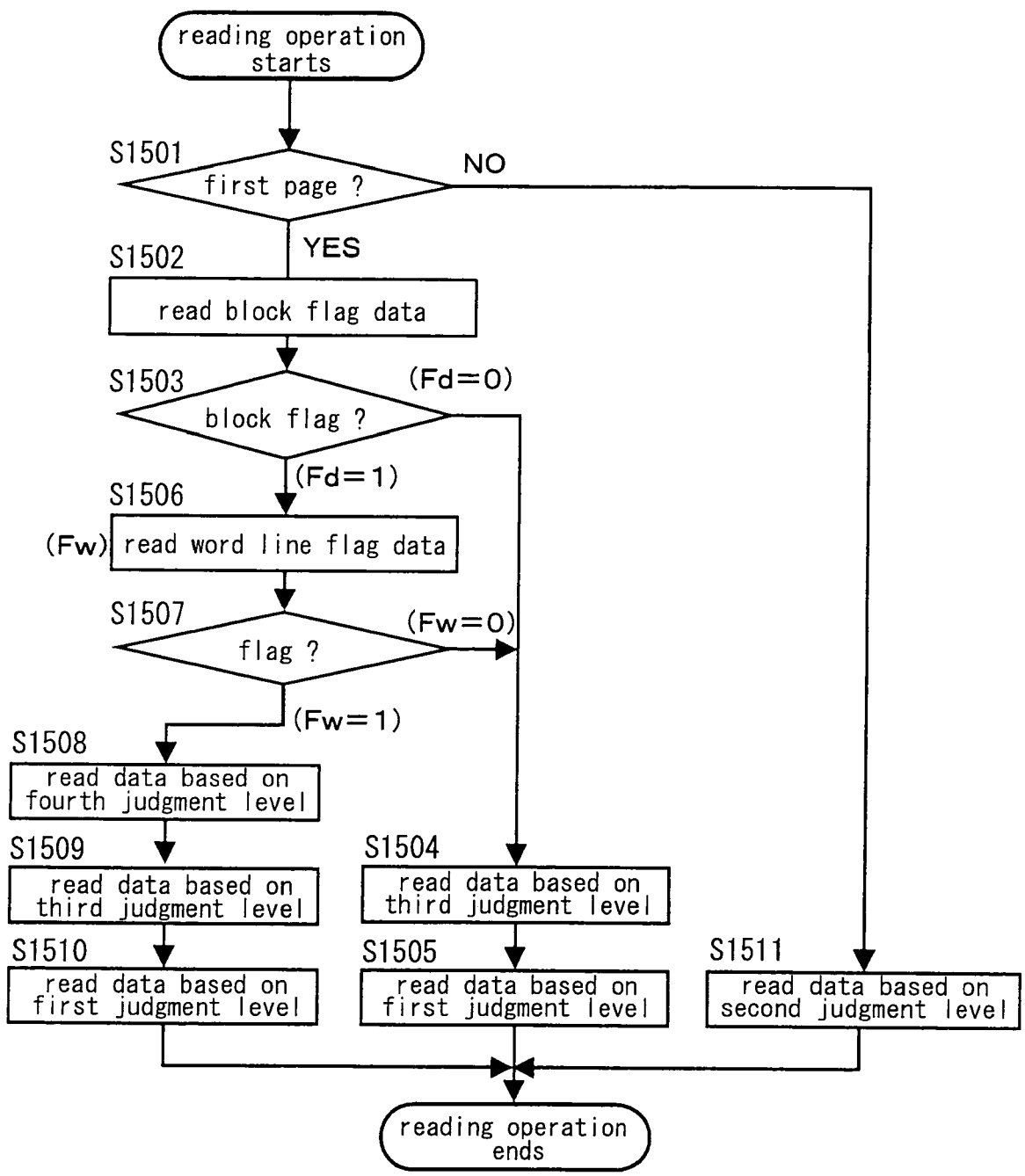
FIG. 15 is a flow chart of a reading operation in the semiconductor memory device according to the preferred embodiment 4.

Next, the data writing operation and the data reading operation to the memory cell arrays 1a and 1b are described referring to FIGS. 14 and 15.

Writing Operation

When the writing operation is commenced, and the page to be written is designated from outside, the memory cell array 1a or in the memory cell array 1b is determined to write the data. Further, it is judged whether or not the designated page is the second page (S1401). The reading operation is different depending on results of the judgment in S1401, which are separately described below based on the judgment results (first page and second page).

The case that the judgment result shows the current writing page is the first page The word line state control circuit 11 reads the writing state data Da from the non-volatile memory circuit 9 (S1402). Then, it is judged from the read writing state data Da whether the data in the second page has not been written (S1403). When it is judged in S1403 that the data in the second page has not been written, the current writing operation is judged to be the writing operation of the first page located in a first-half part of the writing operation in the "forward" writing sequence.

Based on the foregoing judgment, the memory cell where the data is written in the memory cell array 1a or 1b designated earlier is made "0" or "1" in accordance with the write data (S1404). Thus, the current writing operation of the first page is processed as the writing operation in a first-half part (first writing operation) a1 in the writing operation in the "forward" writing sequence.

When it is judged in S1403 that the data in the second page has been written, the current writing operation is judged to be the writing operation of the first page located in a latter-half part of the writing operation in the "reverse" writing sequence.

Based on the foregoing judgment, the memory cell where the data is written in the memory cell array 1a or 1b designated earlier is made "0", "1", "3" or "4" in accordance with the write data as shown in FIG. 2 (S1405). Thus, the current writing operation of the first page is processed as the writing operation in a latter-half part (fourth writing operation) a4 in the writing operation in the "reverse" writing sequence. As described so far, the operation, when the page designated from outside is judged to be the first page, is similar to that of the preferred embodiment 1.

The case that the judgment result shows the current writing page is the second page The word line state control circuit 11 reads the writing state data Da from the non-volatile memory circuit 9 (S1406). Then, it is judged from the read writing state data Da whether or not the data in the first page has been written (S1407). When it is judged in S1407 that the data in the first page has been written, the current writing operation is judged to be the writing operation of the second page located in a latter-half part of the writing operation in the "forward" writing sequence.

Based on the foregoing judgment, the memory cell where the data is written in the memory cell array 1a or 1b designated earlier is made "0", "2" or "3" in accordance with the write data in the second page (S1408). Thus, the current writing operation of the second page is processed as the writing operation in a latter-half part (second writing operation) a2 in the writing operation in the "forward" writing sequence.

When it is judged in S1407 that the data in the first page has not been written, the current writing operation is judged to be the writing operation of the second page located in a first-half part of the writing operation in the writing operation in the "reverse" writing sequence.

Based on the foregoing judgment, "1" is written as the word line flag data Pw in the non-volatile memory circuit 9 by the word line flag control circuit 10 (S1409). The block flag control circuit 14 further writes "1" as the block flag data Fb in the non-volatile memory circuit 9 (S1410). "1" in the block flag data Fb denotes the writing operation in the "reverse" writing sequence. The block flag data Fb, except updating to "1" in S1401, remains "0" (which indicates the writing operation in the "forward" writing sequence).

Then, the memory cell where the data is written in the memory cell array 1a or 1b designated earlier is made "0" or "3" in accordance with the write data (S1411). Thus, the current writing operation of the second page is processed as the writing operation in a first-half part (third writing operation) a3 in the writing operation in the "reverse" writing sequence.

Reading Operation

When the reading operation is commenced, and the page to be read is designated from outside, the memory cell array 1a or the memory cell array 1b, from which the data is read, is designated. Further, it is judged whether or not the designated page is the first page (S1501). The reading operations is different depending on results of the judgment in S1501, which are separately described below based on the judgment results (first page and second page).

The case that the judgment result shows the current reading page is the first page The block flag control circuit 14 reads the block flag data Fb from the non-volatile memory circuit 9 and judges the contents of the read block flag data Fb (S1502 and S1503). When it is judged in S1503 that the block flag data is "0", the data to be read in the current reading operation is judged to be the data written in the "forward" writing sequence.

Based on the foregoing judgment, the state of the memory cell is judged to be any of "0", "1", "2" and "3". Therefore, the data is read from the memory cell from which the data is read in the memory cell array 1a or the memory cell array 1b designated earlier based on the level judgments twice as total for the threshold voltage of the memory cell in which the third judgment level and the first judgment level are used (S1504 and S1505). This is the reading operation of the first-page in the data all written in the "forward" direction.

When it is judged in S1503 that the block flag data Fb is "1", the data to be read in the current reading operation is judged to contain the mixed data written respectively in the "forward" writing sequence and in the "reverse" writing sequence.

Based on the foregoing judgment, it is judged to be necessary to further determine the writing page sequence for each word line. Based on the judgment, the word line flag control circuit 10 reads the word line flag data Fw from the non-volatile memory circuit 9 and judges the contents of the read data Fw (S1506 and S1507). When the word line flag data Fw is judged to be "0" in S1507, the current reading operation is judged to be the reading operation of the data written in the "forward" (first page→second page) direction. In this case, the state of the memory cell is judged to be any of "0", "1", "2" and "3" in a manner similar to the conventional technology shown in FIG. 23. Therefore, the data is read from the memory cell from which the data is read in the memory cell array 1a or the memory cell array 1b designated earlier based on the level judgments twice as total for the threshold voltage of the memory cell in which the third judgment level and the first judgment level are used (S1504 and S1505). This is the reading operation of the first-page data in the data extracted as the data written in the "forward" writing sequence from the mixed data including the data written respectively in the "forward" writing sequence and in the "reverse" writing sequence.

When the word line flag data Fw is judged to be "1" in S1103, the current reading operation is judged to be the reading operation of the data written in the "reverse" writing sequence, in this case the memory cell array 1 is in any of the state "0", state "1", state "3" and state "4". Therefore, the data is read from the memory cell from which the data is read in the memory cell array 1a or the memory cell array 1b designated earlier based on the level judgments three times as total for the threshold voltage of the memory cell in which the fourth judgment level, third judgment level and first judgment level are used as shown in FIG. 3 (S1508, S1509 and S1510). This is the reading operation of the first-page data in the data extracted as the data written in the "reverse" writing sequence from the mixed data including the data written respectively in the "forward" writing sequence and in the "reverse" writing sequence.

When the threshold voltage of the memory cell is judged to be larger than the first judgment level in the level judgment in S1510, the state of the memory cell is "1" or "3"

as shown in FIG. 3, in this case the data in the first page is "0" and "1". Therefore, the third judgment level is necessary in order to discriminate the data in the first page.

The case that judgment result shows the current reading page is the second page The reading operation in this case does not depend on the word line flag data Fw and the chip flag data Fc. Therefore, the threshold voltage of the memory cell is judged based on the second judgment level as shown in FIGS. 3 and 23 so that the data is read from the memory cell from which the data is read in the memory cell array 1a or the memory cell array 1b designated earlier (S1511).

As described, in the preferred embodiment 4, the data can be speedily read from any block in which the data is written in the "forward" writing sequence even though the data is written in the "reverse" direction in part of the pages. As a result, the processing speed in the reading operation is totally improved.

Preferred Embodiment 5

Figure 16:
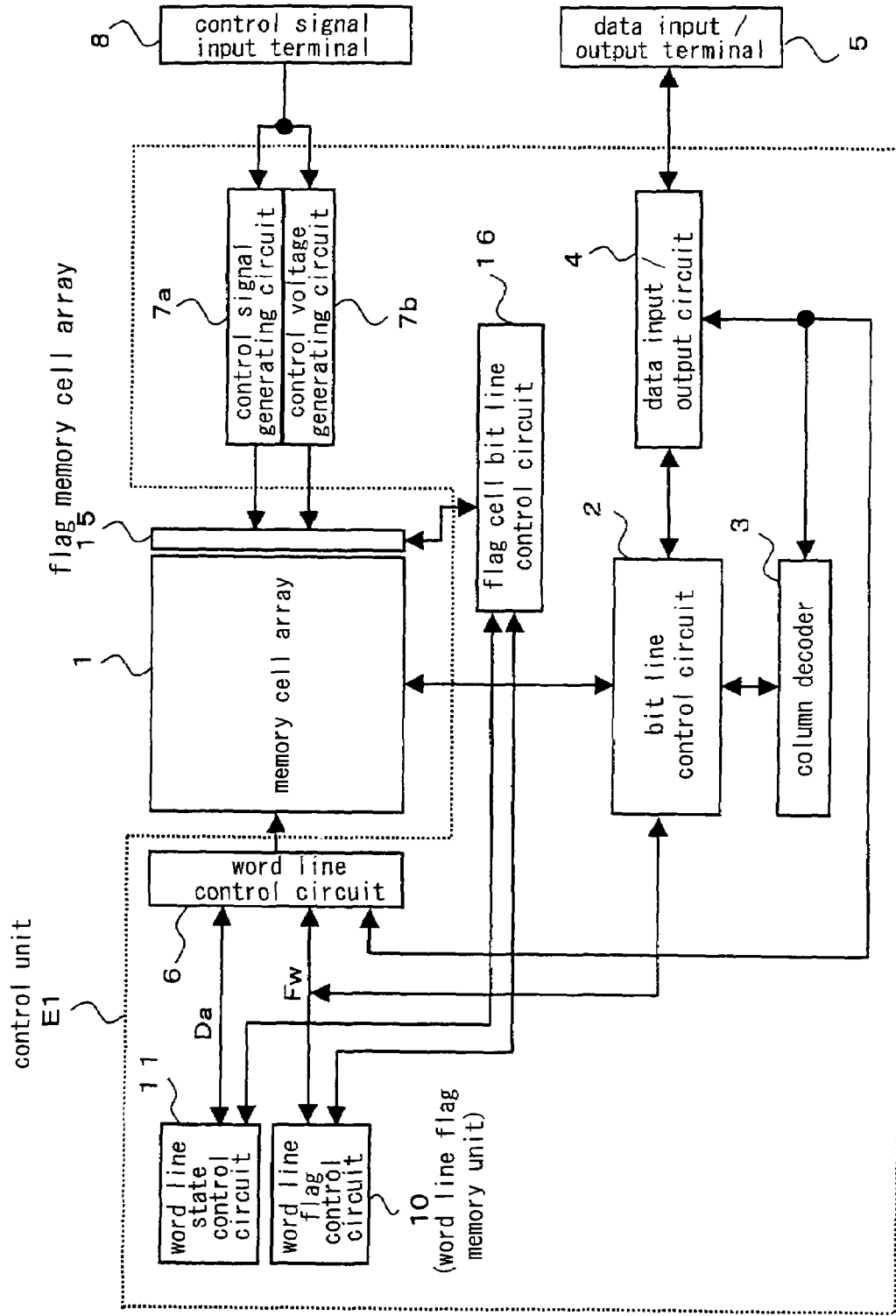
FIG. 16 is a block diagram illustrating a constitution of a semiconductor memory device according to a preferred embodiment 5 of the present invention.

In an embodiment 5 of the present invention, a flag memory cell array 15 is provided in place of the non-volatile memory circuit 9 according to the preferred embodiment 1. The preferred embodiment 5 is described referring to a block diagram illustrating a constitution of a semiconductor memory device shown in FIG. 16 and a memory cell array shown in FIG. 17.

As shown in FIG. 17, the flag memory cell array 15 is a memory cell array comprising memory cells provided on the same word lines as those of the memory cell array 1, and comprises the memory cells of the same type as that of the memory cells of the memory cell array 1. The flag memory cell array 15 memorizes the word line flag data Fw and the writing state data Da. The memory cells of the memory cell array 1 are smaller in terms of area than the non-volatile memory circuit 9. Therefore, the area of the memory circuit for memorizing the flag data Fw and the writing state data Da can be reduced.

A flag cell bit line control circuit 16 includes a data memory circuit. The flag cell bit line control circuit 16 executes processing for reading the data in the memory cell of the flag memory cell array 15 via the bit lines, detecting a state of the memory cell in the flag memory cell array 15 via the bit lines, and applying a writing control voltage to the memory cell of the flag memory cell array 15 via the bit lines to thereby write the data in the memory cell.

The word line flag control circuit 10 and the word line state control circuit 11 are connected to the flag cell bit line control circuit 16. The word line flag control circuit 10 transmits and receives the word line flag data Fw. The word line state control circuit 11 transmits and receives the writing state data Da.

Any other component, which is similar to that of the preferred embodiment 1 shown in FIG. 1, is simply provided with the same reference number and not described in detail again.

Figure 18:
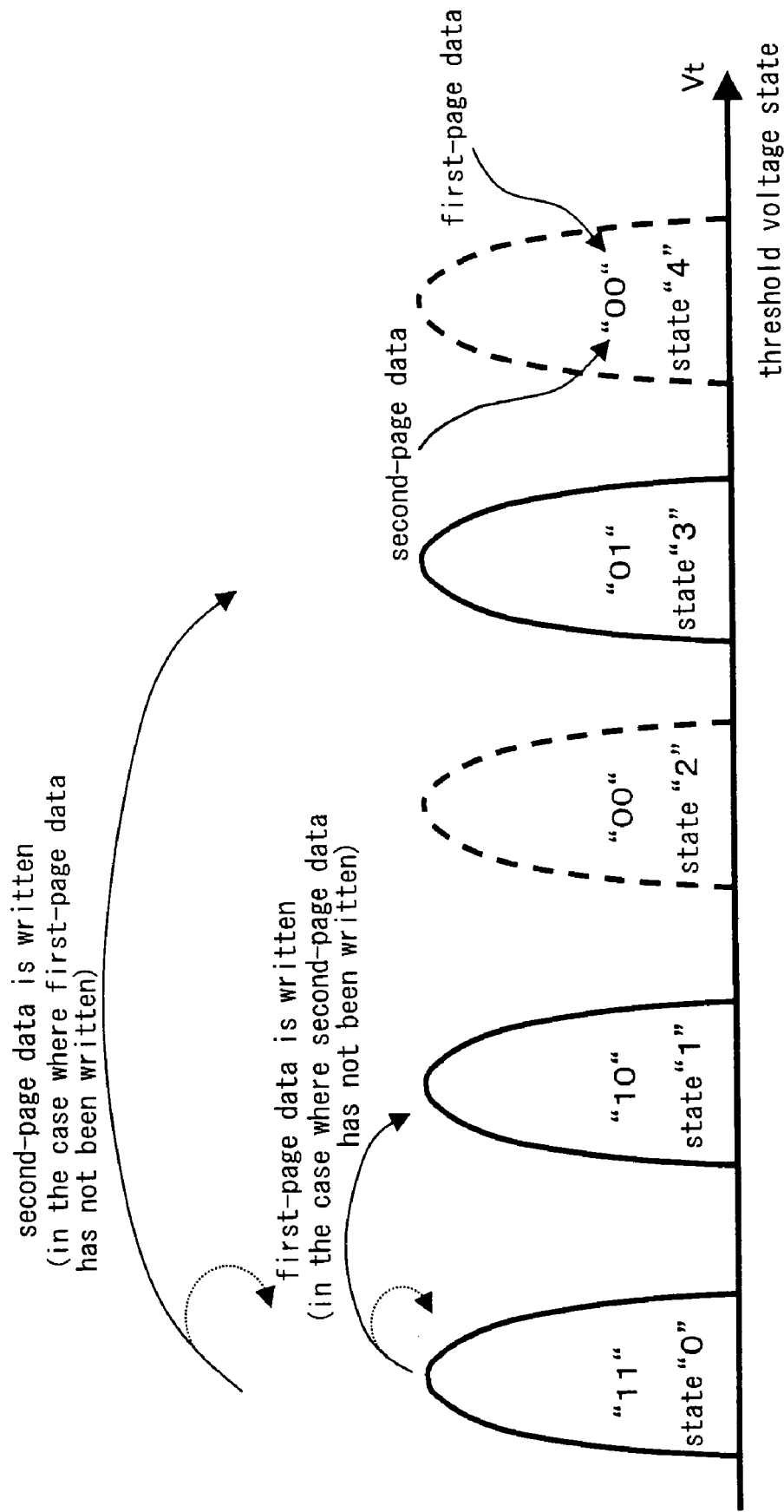
FIG. 18 shows shifts of a memory cell threshold voltage of a flag memory cell array in the semiconductor memory device according to the preferred embodiment 5.

Next, referring to FIG. 18, the shifts of the state of the memory cell of the flag memory cell array 15 are described when the word line flag data Fw and the writing state data Da are written.

When the data is written in the "forward" direction (first page→second page) in the erased state, that is, in the state "0" of the memory cell, the state of the flag memory cell array 15 is shifted to "1". When the data in the second page is thereafter written, the state of the flag memory cell array 15 still remains "1".

When the data is written in the "reverse" direction (second page→first page) in the erased state, that is, in the state "0" of the memory cell, the state of the flag memory cell array 15 is shifted to "3". When the data in the first page is thereafter written, the state of the flag memory cell array 15 still remains "1".

Because the flag memory cell array 15 and the memory cell array 1 are connected to the same word lines, the writing operation to the flag memory cell array 15 is executed at the same time as the data writing operation to the memory cell array 1.

Figure 19:
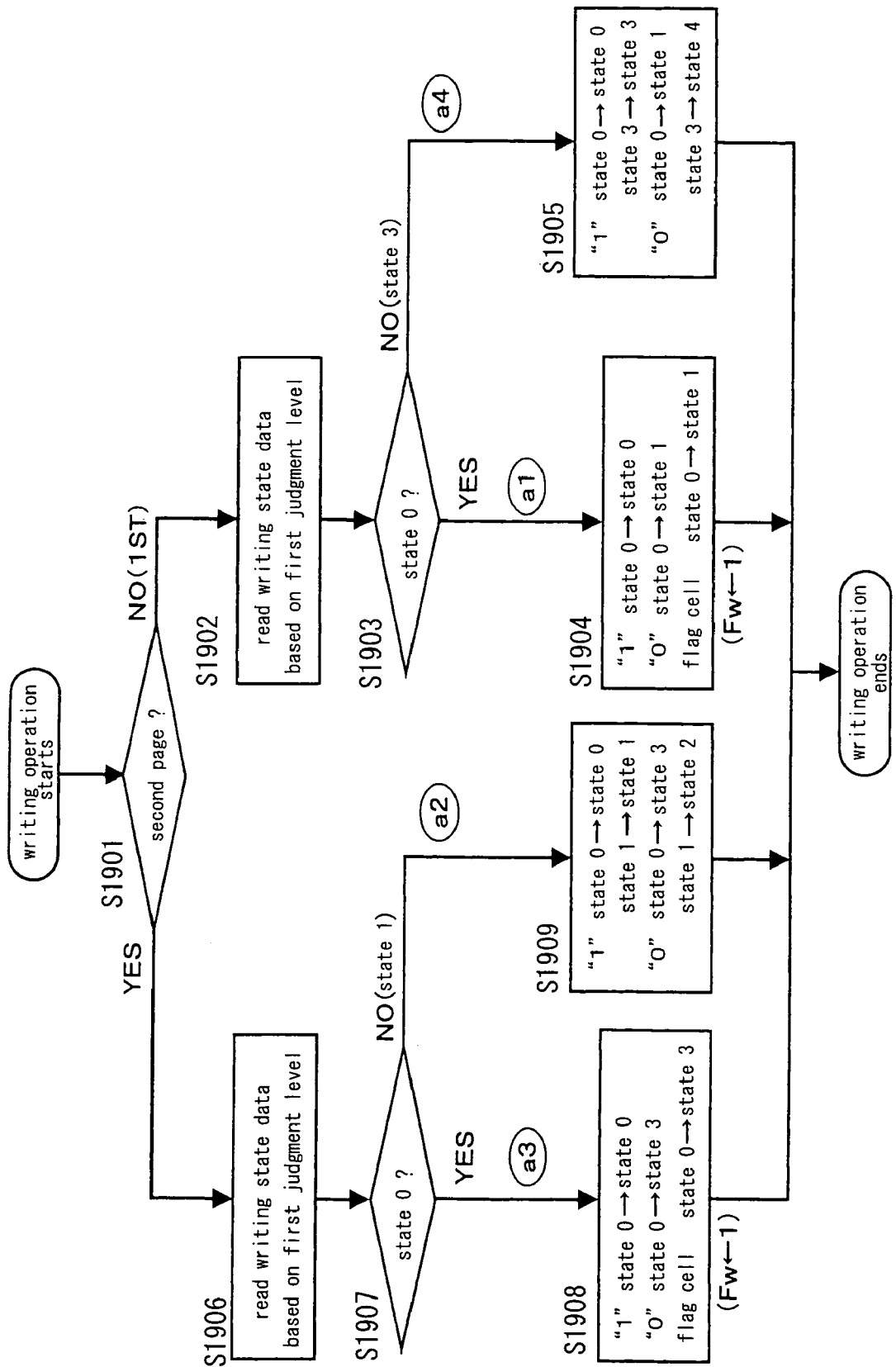
FIG. 19 is a flow chart of a writing operation in the semiconductor memory device according to the preferred embodiment 5.
Figure 20:
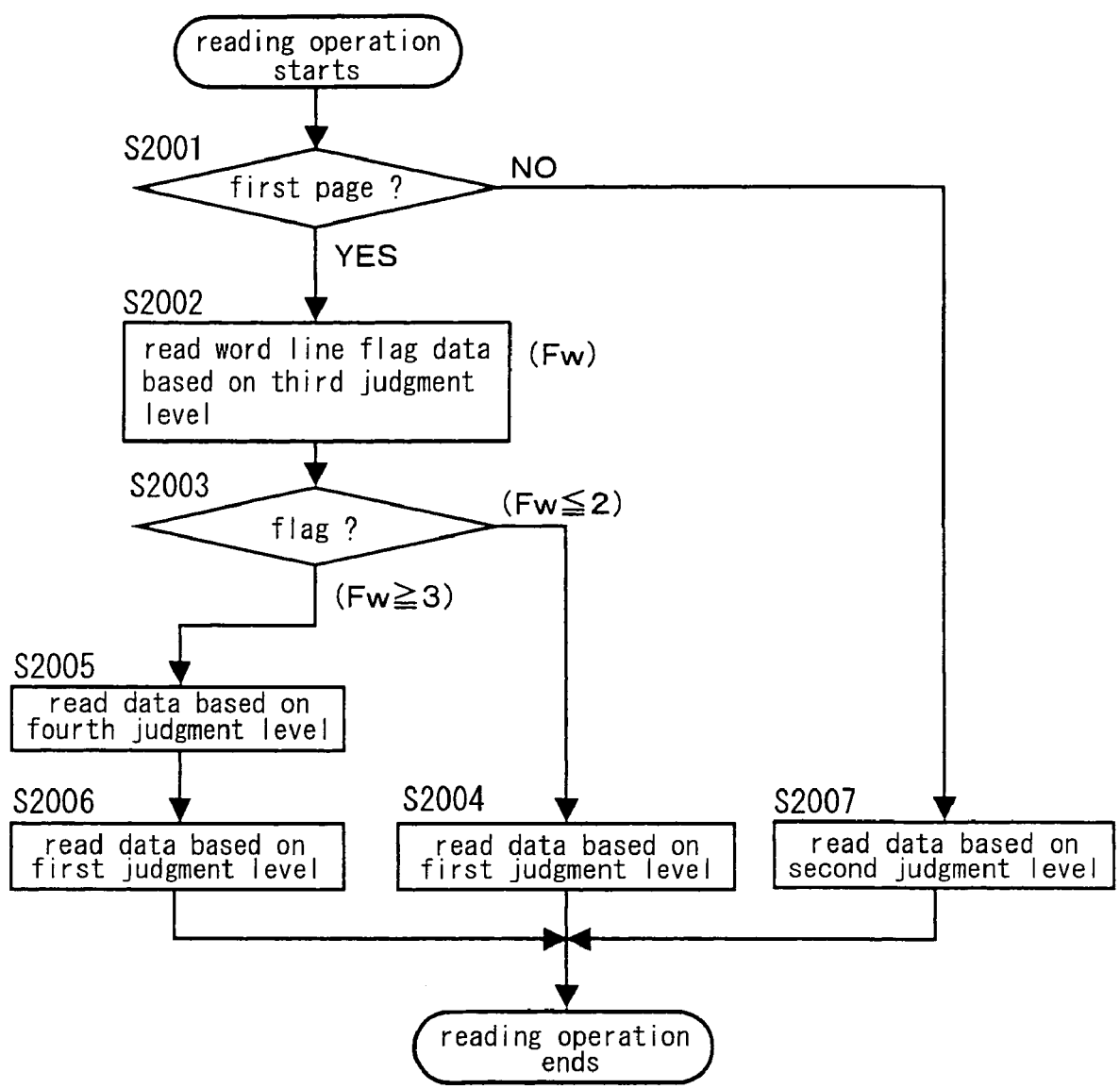
FIG. 20 is a flow chart of a reading operation in the semiconductor memory device according to the preferred embodiment 5.

The data writing and reading operations to each of the memory cell array 1 and the flag memory cell array 15 are described referring to FIGS. 19 and 20.

Writing Operation

When the writing operation is commenced, and the page to be written is designated from outside, it is judged whether or not the designated page is the second page (S1901). The writing operation is different depending on results of the judgment in S1901, which are separately described below based on the judgment results (first page and second page).

The case that the judgment result shows the current writing page is the first page The word lines are set to the first judgment level. Then, the writing state data Da is read from the flag memory cell array 15, and the contents of the read data Da are judged (S1902 and S1903). When the read writing state data Da is judged to be in the state "0" in S1903, it is judged that the data has not been written in the memory cell of the relevant word line. In other words, the current writing operation is judged to be the writing operation of the first page located in a first-half part of the writing operation in the "forward" writing sequence.

Based on the foregoing judgment, the state of the memory cell of the memory cell array 1 is shifted to "0" or "1" in accordance with the write data in the first page, and the state of the word line flag data Fw of the flag memory cell array 15 is shifted to "1" (S1903). Thus, the current writing operation of the first page is processed as the writing operation in a first-half part (first writing operation) a1 in the writing operation in the "forward" writing sequence.

When the read writing state data Da is judged to be not in the state "0" in S1093, it is judged that the data has been written in the memory cell of the relevant word line, in other words, the current writing operation is judged to be the writing operation of the first page located in a latter-half part of the writing operation in the "reverse" writing sequence.

Based on the foregoing judgment, the state of the memory cell is shifted to "0" "1", "3" or "4" in accordance with the write data as shown in FIG. 2 (S1905). Thus, the current writing operation of the first page is processed as the writing operation in a latter-half part (fourth writing operation) a4 in the writing operation in the "reverse" writing sequence.

The case that the judgment result shows the current writing page is the second page After the word lines are set to the first judgment level, the writing state data Da is read from the flag memory cell array 15, and the contents of the read data Da are judged (S1906 and S1907). When the read writing state data Da is judged to be in the state "0" in S1907, it is judged that the data has not been written in the memory cell of the relevant word line. In other words, the current writing operation is judged to be the writing operation of the second page located in a first-half part of the writing operation in the "reverse" writing sequence.

Based on the foregoing judgment, the state of the memory cell of the memory cell array 1 is shifted to "0" or "3" in accordance with the write data in the second page, and the word line flag data Fw of the flag memory cell array 15 is shifted to the state "3" (S1908). Thus, the writing operation of the second page is processed as the writing operation in a first-half part (third writing operation) a3 in the writing operation in the "reverse" writing sequence.

Meanwhile, when it is judged in S1907 that the read writing state data Da is not in the state "0", it is judged that the data has been written in the memory cell of the relevant word line. In other words, the current writing operation is judged to be the writing operation of the second page located in a latter-half part of the writing operation in the "forward" writing sequence.

Based on the foregoing judgment, the state of the memory cell is shifted to "0", "1", "2" or "3" in accordance with the write data as shown in FIG. 2 (S1909). Thus, the writing operation of the second page is processed as the writing operation in a latter-half part (second writing operation) a2 in the writing operation in the "forward" writing sequence.

Reading Operation

When the reading operation is commenced, and the page to be read is designated from outside, it is judged whether or not the designated page is the first page (S2001). The reading operations is different depending on results of the judgment in S2001, which are separately described below based on the judgment results (first page and second page).

The case that the judgment result shows the current reading page is the first page In a state that the word lines are set to the third judgment level, the word line flag data Fw is read from the flag memory cell array 15, and the contents of the read data Fw are judged (S2002 and S2003). The word lines are set to the third judgment level in order to reduce number of times to set the word line necessary for reading the memory cell data of the memory cell array 1 in the subsequent operation. More specifically, when the word lines are set to the third judgment level and the writing state data Da is read from the flag memory cell array 15, the memory cell data of the memory cell array 1 is simultaneously latched in the bit line control circuit 2.

When the read word line flag data Fw is judged to be in at most the state "2" in S2003, it is judged that the current reading operation is the reading operation of the data written in the "forward" writing sequence. In this case, the state of the memory cell is any of "0", "1", "2" and "3" in a manner similar to the conventional technology shown in FIG. 23. Therefore, the data is read based on the level judgments twice as total for the threshold voltage of the memory cell in which the first judgment level and the third judgment level are used, which means that the reading operations at the first judgment level and the third judgment level are necessary for determining the data. However, the data has already been read based on the level judgment for the threshold voltage of the memory cell in which the third judgment level was used in S2002. Therefore, the level of the threshold voltage of the memory cell may be judged only once (S2004).

When the word line flag data Fw is judged to be in at least the state "3" in S2003, the current reading operation is judged to be the reading operation of the data written in the "reverse" writing sequence. In this case, the state of the memory cell is any of "0", "1", "3" and "4" in a manner similar to the conventional technology shown in FIG. 23. Therefore, the data is read based on the level judgments three times as total for the threshold voltage of the memory cell where the first judgment level, third judgment level and fourth judgment level are used, which means that the reading operations at the first judgment level, third judgment level and fourth judgment level are necessary for determining the data. However, the data has already been read based on the level judgment for the threshold voltage of the memory cell in which the third judgment level was used in S2002. Therefore, the level of the threshold voltage of the memory cell may be judged only twice as total (S2005 and S2006).

The case that the judgment result shows the current reading page is the second page In this case, as the reading operation does not depend on the word line flag data Fw, the data is read when the threshold voltage of the memory cell is judged based on the second judgment level as shown in FIGS. 3 and 23 (S2007), which applies to both of the reading operations of the data written in the "forward" writing sequence and in the "reverse" writing sequences.

As described, in the preferred embodiment 5, an area of the memory where the word line flag data Fw and the writing state data Da are memorized can be reduced.

Though the preferred embodiments of this invention has been described in detail, it will be understood that various modifications may be made therein, and it is intended to cover in the appended claims all such modifications as fall within the true spirit and scope of this invention.

What is claimed is:

1. A semiconductor memory device for memorizing data in a state where the data can be discriminated with any of a plurality of threshold voltages that is at least $2^n+1$ different each other in order to memorize an n–value data (n is an integer at least two).

2. The semiconductor memory device according to claim 1, wherein a corresponding relationship between the threshold voltage and the data is changed in accordance with a sequence of addresses at which the data is written.

3. The semiconductor memory device comprising:

a memory cell array having a plurality of memory cells for memorizing data in a state where the data can be discriminated with any of 0th through fourth threshold voltages under such a magnitude relation as 0th threshold voltage<first threshold voltage<second threshold voltage<third threshold voltage<fourth threshold voltage, the memory cells being arranged in a lattice shape and respectively connected to word lines and bit lines;

a controller for controlling writing operations when the data in first and second pages are written in the memory cell; and a flag memory unit for memorizing a flag data showing a chronological sequence relationship between the writing operations in which the data in the first page is written in the memory cell and in which the data in the second page is written in the memory cell, wherein the controller executes:

an operation in which a state of the memory cell is shifted from the state where the data can be discriminated with the 0th threshold voltage to the state where the data can be discriminated with the 0th threshold voltage or the first threshold voltage in accordance with the data to be written in the writing operation of the first page in a "forward" (first page→second page) writing sequence;

an operation in which the state of the memory cell is shifted to the state where the data can be discriminated with any of the 0th threshold voltage, the first threshold voltage, the second threshold voltage and the third threshold voltage in accordance with the data to be written in the writing operation of the second page in the "forward" writing sequence;

an operation in which the state of the memory cell is shifted from the state in which the data can be discriminated with the 0th threshold voltage to the state in which the data can be discriminated with the 0th threshold voltage or the third threshold voltage in accordance with the data to be written in the writing operation in which the data in the second page is written in a "reverse" (second page→first page) writing sequence; and an operation in which the state of the memory cell is shifted to the state where the data can be discriminated with any of the 0th threshold voltage, the first threshold voltage, the third threshold voltage and the fourth threshold voltage in accordance with the data to be written in the writing operation of the first page in the "reverse" writing sequence, and the flag memory unit memorizes a flag data showing the "reverse" writing sequence in the both writing operations in the "reverse" writing sequence.

4. The semiconductor memory device according to claim 3, wherein the flag memory unit memorizes a flag data showing the "forward" writing sequence in the both writing operations in the "forward" writing sequence, and the controller executes:

an operation in which it is determined whether the data is discriminated in the state of the memory cell at any of the 0th threshold voltage, the first threshold voltage, the second threshold voltage and the third threshold voltage, and the data is read from the memory cell based on a result of the determination when the flag data memorized in the flag memory unit shows the "forward" writing sequence; and an operation in which it is determined whether the data is discriminated in the state of the memory cell at any of the 0th threshold voltage, the first threshold voltage, the third threshold voltage and the fourth threshold voltage, and the data is read from the memory cell based on a result of the determination when the flag data memorized in the flag memory unit shows the "reverse" writing sequence.

5. The semiconductor memory device according to claim 4, wherein the controller judges whether the data can be discriminated with the first threshold voltage or the second threshold voltage in the memory cell, and then reads the data in the second page when the data in the second page is to be read.

6. The semiconductor memory device according to claim 3, further comprising a volatile memory capable of reading and writing the data at a high speed, wherein the controller transfers the flag data from the flag memory unit to the volatile memory at a desired timing and transfers the flag data from the volatile memory to the flag memory unit at a timing different from the desired timing.

7. The semiconductor memory device according to claim 3, further comprising a word line flag memory unit for memorizing the flag data in each word line.

8. The semiconductor memory device according to claim 7, further comprising a chip flag memory unit for managing all of the flag data states.

9. The semiconductor memory device according to claim 7, further comprising a block flag memory unit for managing the state of the flag data in each block consisting of a plurality of pages as a unit.

10. The semiconductor memory device according to claim 7, wherein the word line flag memory unit is a same type of a flag memory cell as that of the memory cells provided on the same word line in the word lines of the memory cell array.

11. A semiconductor memory device according to claim 10, further comprising a flag cell bit line control circuit for shifting a state of the flag memory cell from the state where the data can be discriminated with the 0th threshold voltage to the state where the data can be discriminated with the first threshold voltage in the writing operation in the "forward" writing sequence, and shifting the state of the flag memory cell from the state where the data can be discriminated with the 0th threshold voltage to the state where the data can be discriminated with the third threshold voltage in the writing operation in the "reverse" writing sequence.

12. The semiconductor memory device according to claim 11, wherein the flag cell bit line control circuit sets a word-line voltage to a voltage between the second threshold voltage and the third threshold voltage in order to judge the state of the flag memory cell.

13. A control method for semiconductor memory device comprising:

a first step in which, when a data in a first page is written in a "forward" writing sequence (first page→second page) in a memory cell array comprising a plurality of memory cells for memorizing data in a state where the data can be discriminated with any of 0th through fourth threshold voltages having such a magnitude relation as 0th threshold voltage<first threshold voltage<second threshold voltage<third threshold voltage<fourth threshold voltage, wherein the memory cells are arranged in a lattice shape and respectively connected to word lines and bit lines, a state of the memory cell is shifted from the state where the data can be discriminated with the 0th threshold voltage to the state where the data can be discriminated with the 0th threshold voltage or the first threshold voltage in accordance with the data to be written;

a second step in which the state of the memory cell is shifted to the state where the data can be discriminated with any of the 0th threshold voltage, the first threshold voltage, the second threshold voltage and the third threshold voltage in accordance with the data to be written when a second page is written in the memory cell array in the "forward" writing sequence;

a third step in which the state of the memory cell is shifted from the state where the data can be discriminated with the 0th threshold voltage to the state where the data can be discriminated with the 0th threshold voltage or the third threshold voltage in accordance with the data to be written when the second page is written in the memory cell array in a "reverse" (second page→first page) writing sequence; and a fourth step in which the state of the memory cell is shifted to the state where the data can be discriminated with any of the 0th threshold voltage, the first threshold voltage, the third threshold voltage and the fourth threshold voltage in accordance with the data to be written when the first page is written in the memory cell array in the "reverse" writing sequence, wherein a flag data showing the "forward" writing sequence is memorized in the first and second steps, and a flag data showing the "reverse" writing sequence is memorized in the third and fourth steps.

14. The control method for semiconductor memory device according to claim 13, further comprising:

a step where the memorized flag data is read;

a step where it is determined whether the data is discriminated in the state of the memory cell at any of the 0th threshold voltage, the first threshold voltage, the second threshold voltage and the third threshold voltage, and the data is read from the memory cell based on a result of the determination when the read flag data shows the "forward" writing sequence; and a step where it is determined whether the data is discriminated in the state of the memory cell at any of the 0th threshold voltage, the first threshold voltage, the second threshold voltage and the third threshold voltage, and the data is read from the memory cell based on a result of the determination when the read flag data shows the "reverse" writing sequence.

15. The control method for semiconductor memory device according to claim 14, wherein it is judged whether the data can be discriminated with the first threshold voltage or the second threshold voltage in the memory cell, and then reads the data in the second page when the data in the second page is read.

* * * * *